(12) United States Patent
Dedic et al.

(10) Patent No.: US 6,496,129 B2
(45) Date of Patent: Dec. 17, 2002

(54) SEGMENTED CIRCUITRY

(75) Inventors: Ian Juso Dedic, Northolt (GB); Sanjay Ashwin-Kumar Umedbhai Patel, Reading (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/968,782

(22) Filed: Oct. 3, 2001

(65) Prior Publication Data

US 2002/0084925 A1 Jul. 4, 2002

(30) Foreign Application Priority Data

Oct. 26, 2000 (EP) .............................................. 00309413
Jan. 18, 2001 (GB) ............................................... 0101307

(51) Int. Cl.[7] .............................................. H03M 1/66
(52) U.S. Cl. ....................................................... 341/144
(58) Field of Search ................................ 341/143, 144, 341/153

(56) References Cited

U.S. PATENT DOCUMENTS

| | | | |
|---|---|---|---|
| 4,791,406 A | | 12/1988 | Mehrgardt et al. |
| 4,935,741 A | | 6/1990 | Reich |
| 5,138,317 A | * | 8/1992 | Story ........................... 341/144 |
| 5,305,004 A | * | 4/1994 | Fattaruso ..................... 341/120 |
| 5,319,370 A | | 6/1994 | Signore et al. |
| 5,856,799 A | * | 1/1999 | Hamasaki et al. .......... 341/144 |
| 5,995,031 A | | 11/1999 | Okuda et al. |
| 6,218,974 B1 | | 4/2001 | Dedic |
| 6,236,346 B1 | | 5/2001 | Schofield et al. |

FOREIGN PATENT DOCUMENTS

| | | | |
|---|---|---|---|
| EP | 1 100 203 | 5/2001 | |
| GB | 2 296 398 | 6/1996 | |
| GB | 2 356 304 | 5/2001 | |
| JP | P2001-237704 A | * 8/2001 | ............. H03M/1/66 |

OTHER PUBLICATIONS

Carley, L. R.; *A Noise–Shaping Coder Topology for 15+ Bit Converters*; IEEE Journal of Solid–State Circuits, vol. 24, No. 2, Apr. 1989, pp. 267–273.*
Lecture Notes for Delta–Sigma Data Converters, Mar. 16–19, 1999, SanDiego, California.

* cited by examiner

Primary Examiner—Howard L. Williams
(74) Attorney, Agent, or Firm—Staas & Halsey LLP

(57) ABSTRACT

Mixed-signal circuitry, such as a digital-to-analog converter (DAC) device, performs a series of operation cycles. The circuitry has n circuitry segments ($2_1$, $4_1$ to $2_n$, $4_n$) which together produce an analog output signal ($I_A$–$I_B$). In each cycle a transfer function morphing section (22) generates, in dependence upon a digital input signal (D1-Dm), a set of n segment control signals (T1-Tn) for application to respective ones of said segments to influence the produced analog output signal. The n segment control signals are caused to be applied to the n segments in at least two different orders at different respective times. At least one order differs from the next order by more than a starting ordinal position amongst the segments. Also, the changes in ordinal position of the segments brought about by the changes in order of application of the segment control signals are limited in number and/or magnitude relative to said number n of segments. This changes a transfer function (accumulated non-linearity error caused by amplitude and/or delay mismatches between the segments) between two or more different forms over the course of the operation cycles. This reduces the transfer function variation between different manufactured devices which in turn can provide an improvement in guaranteed minimum performance for a given manufacturing yield or an improvement in yield for a given performance.

Segmented circuitry having segments with well-defined and less-well-defined analog quantities is also disclosed (FIG. 29). The well-defined quantities are selected in use of the circuitry and the less-well-defined quantities are selected in a testing or setting up mode.

44 Claims, 26 Drawing Sheets

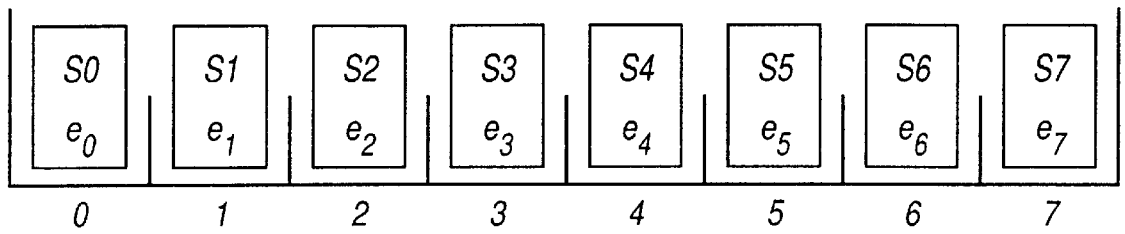
Fig.9(A) POSITION IN TRANSFER FUNCTION
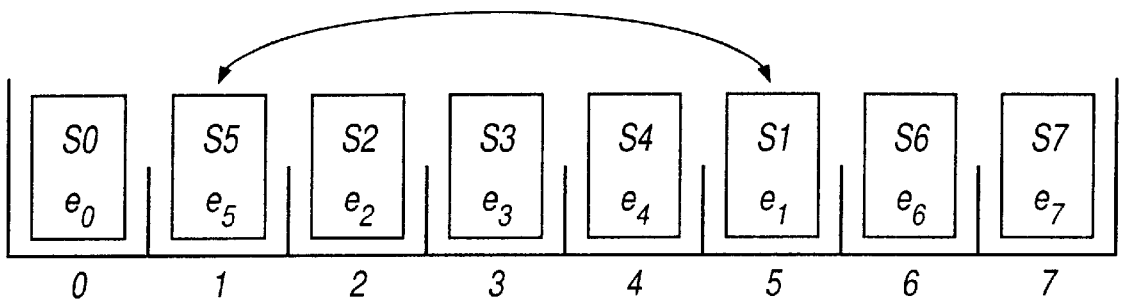
Fig.9(B) POSITION IN TRANSFER FUNCTION
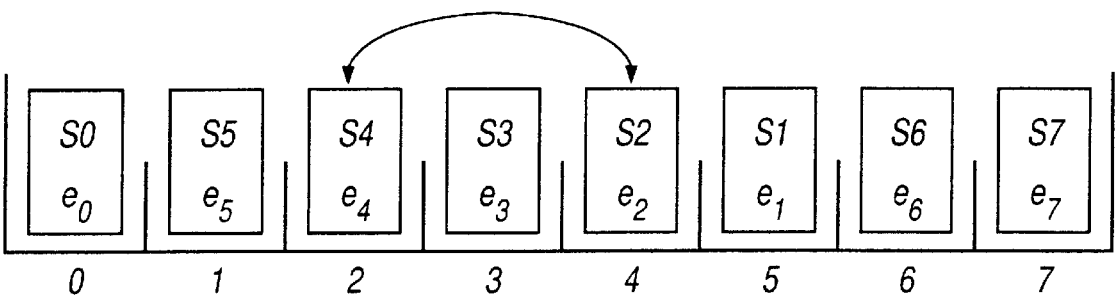
Fig.9(C) POSITION IN TRANSFER FUNCTION

| Ordinal position | First conversion cycle | | Second conversion cycle | | Third conversion cycle | |
|---|---|---|---|---|---|---|
| | Segment in that Ordinal position | Random source error of that segment | Segment in that Ordinal position | Random source error of that segment | Segment in that Ordinal position | Random source error of that segment |
| 0 | 0 | $e_0(\mu+1)$ | 0 | $e_0(\mu+1)$ | 0 | $e_0(\mu+1)$ |
| 1 | 1 | $e_1(\mu+1.5)$ | 5 | $e_5(\mu-3)$ | 5 | $e_5(\mu-3)$ |
| 2 | 2 | $e_2(\mu-1)$ | 2 | $e_2(\mu-1)$ | 4 | $e_4(\mu+1)$ |
| 3 | 3 | $e_3(\mu-0.5)$ | 3 | $e_3(\mu-0.5)$ | 3 | $e_3(\mu-0.5)$ |
| 4 | 4 | $e_4(\mu+1)$ | 4 | $e_4(\mu+1)$ | 2 | $e_2(\mu-1)$ |
| 5 | 5 | $e_5(\mu-3)$ | 1 | $e_1(\mu+1.5)$ | 1 | $e_1(\mu+1.5)$ |
| 6 | 6 | $e_6(\mu-0.5)$ | 6 | $e_6(\mu-0.5)$ | 6 | $e_6(\mu-0.5)$ |
| 7 | 7 | $e_7(\mu+1.5)$ | 7 | $e_7(\mu+1.5)$ | 7 | $e_7(\mu+1.5)$ |

Fig.11

| ID | B2 | B1 | B0 |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

Fig.13

| Segment | Morph_id[2] | Morph_id[1] | Morph_id[0] |
|---|---|---|---|
| 0 | $B2$ | $B1$ | $B0$ |
| 1 | $B2$ | $B1$ | $\overline{B0}$ |
| 2 | $B2$ | $\overline{B1}$ | $B0$ |
| 3 | $B2$ | $\overline{B1}$ | $\overline{B0}$ |
| 4 | $\overline{B2}$ | $B1$ | $B0$ |
| 5 | $\overline{B2}$ | $B1$ | $\overline{B0}$ |
| 6 | $\overline{B2}$ | $\overline{B1}$ | $B0$ |
| 7 | $\overline{B2}$ | $\overline{B1}$ | $\overline{B0}$ |

Fig.14

| ID | B2d | B2c | B2b | B2a | B1b | B1a | B0 |
|---|---|---|---|---|---|---|---|
| 0 | X | X | X | 0 | X | 0 | 0 |
| 1 | X | X | 0 | X | 0 | X | 1 |
| 2 | X | 0 | X | X | X | 1 | 0 |
| 3 | 0 | X | X | X | 1 | X | 1 |
| 4 | X | X | X | 1 | X | 0 | 0 |
| 5 | X | X | 1 | X | 0 | X | 1 |
| 6 | X | 1 | X | X | X | 1 | 0 |
| 7 | 1 | X | X | X | 1 | X | 1 |

Fig.15

| Segment | Morph_id[2] | Morph_id[1] | Morph_id[0] |
|---|---|---|---|
| 0 | B2a | B1a | B0 |
| 1 | B2b | B1b | $\overline{B0}$ |
| 2 | B2c | $\overline{B1a}$ | B0 |
| 3 | B2d | $\overline{B1b}$ | $\overline{B0}$ |
| 4 | $\overline{B2a}$ | B1a | B0 |
| 5 | $\overline{B2b}$ | B1b | $\overline{B0}$ |
| 6 | $\overline{B2c}$ | $\overline{B1a}$ | B0 |
| 7 | $\overline{B2d}$ | $\overline{B1b}$ | $\overline{B0}$ |

Fig.16

| Segment decoder no. | morph_id[3] | morph_id[2] | morph_id[1] | morph_id[0] |
|---|---|---|---|---|
| 0 | $\overline{B3a}$ | $\overline{B2a}$ | $\overline{B1a}$ | $\overline{B0}$ |
| 1 | $\overline{B3b}$ | $\overline{B2b}$ | $\overline{B1b}$ | B0 |
| 2 | $\overline{B3c}$ | $\overline{B2c}$ | B1a | $\overline{B0}$ |
| 3 | $\overline{B3d}$ | $\overline{B2d}$ | B1b | B0 |
| 4 | $\overline{B3e}$ | B2a | $\overline{B1a}$ | $\overline{B0}$ |
| 5 | $\overline{B3f}$ | B2b | $\overline{B1b}$ | B0 |
| 6 | $\overline{B3g}$ | B2c | B1a | $\overline{B0}$ |
| 7 | $\overline{B3h}$ | B2d | B1b | B0 |
| 8 | B3a | $\overline{B2a}$ | $\overline{B1a}$ | $\overline{B0}$ |
| 9 | B3b | $\overline{B2b}$ | $\overline{B1b}$ | B0 |
| 10 | B3c | $\overline{B2c}$ | B1a | $\overline{B0}$ |
| 11 | B3d | $\overline{B2d}$ | B1b | B0 |
| 12 | B3e | B2a | $\overline{B1a}$ | $\overline{B0}$ |
| 13 | B3f | B2b | $\overline{B1b}$ | B0 |
| 14 | B3g | B2c | B1a | $\overline{B0}$ |
| 15 | B3h | B2d | B1b | B0 |

*Fig.23*

| Input enables | | Intermediate decode (select bit to toggle) | | | | | | | | | | | | | | |
|---|---|---|---|---|---|---|---|---|---|---|---|---|---|---|---|---|
| group_en | local_en | B3h | B3g | B3f | B3e | B3d | B3c | B3b | B3a | B2d | B2c | B2b | B2a | B1b | B1a | B0 |
| 0 | xxxx | 0 | 0 | 0 | 0 | 0 | 0 | 0 | 0 | 0 | 0 | 0 | 0 | 0 | 0 | 0 |
| 1 | 0000 | 0 | 0 | 0 | 0 | 0 | 0 | 0 | 0 | 0 | 0 | 0 | 0 | 0 | 0 | 1 |
| 1 | 0001 | 0 | 0 | 0 | 0 | 0 | 0 | 0 | 0 | 0 | 0 | 0 | 0 | 0 | 1 | 0 |
| 1 | 0010 | 0 | 0 | 0 | 0 | 0 | 0 | 0 | 0 | 0 | 0 | 0 | 0 | 1 | 0 | 0 |
| 1 | 0011 | 0 | 0 | 0 | 0 | 0 | 0 | 0 | 0 | 0 | 0 | 0 | 1 | 0 | 0 | 0 |
| 1 | 0100 | 0 | 0 | 0 | 0 | 0 | 0 | 0 | 0 | 0 | 0 | 1 | 0 | 0 | 0 | 0 |
| 1 | 0101 | 0 | 0 | 0 | 0 | 0 | 0 | 0 | 0 | 0 | 1 | 0 | 0 | 0 | 0 | 0 |
| 1 | 0110 | 0 | 0 | 0 | 0 | 0 | 0 | 0 | 0 | 1 | 0 | 0 | 0 | 0 | 0 | 0 |
| 1 | 0111 | 0 | 0 | 0 | 0 | 0 | 0 | 0 | 1 | 0 | 0 | 0 | 0 | 0 | 0 | 0 |
| 1 | 1000 | 0 | 0 | 0 | 0 | 0 | 0 | 1 | 0 | 0 | 0 | 0 | 0 | 0 | 0 | 0 |
| 1 | 1001 | 0 | 0 | 0 | 0 | 0 | 1 | 0 | 0 | 0 | 0 | 0 | 0 | 0 | 0 | 0 |
| 1 | 1010 | 0 | 0 | 0 | 0 | 1 | 0 | 0 | 0 | 0 | 0 | 0 | 0 | 0 | 0 | 0 |
| 1 | 1011 | 0 | 0 | 0 | 1 | 0 | 0 | 0 | 0 | 0 | 0 | 0 | 0 | 0 | 0 | 0 |
| 1 | 1100 | 0 | 0 | 1 | 0 | 0 | 0 | 0 | 0 | 0 | 0 | 0 | 0 | 0 | 0 | 0 |
| 1 | 1101 | 0 | 1 | 0 | 0 | 0 | 0 | 0 | 0 | 0 | 0 | 0 | 0 | 0 | 0 | 0 |
| 1 | 1110 | 0 | 0 | 0 | 0 | 0 | 0 | 0 | 0 | 0 | 0 | 0 | 0 | 0 | 0 | 0 |
| 1 | 1111 | 1 | 0 | 0 | 0 | 0 | 0 | 0 | 0 | 0 | 0 | 0 | 0 | 0 | 0 | 0 |

Fig. 24

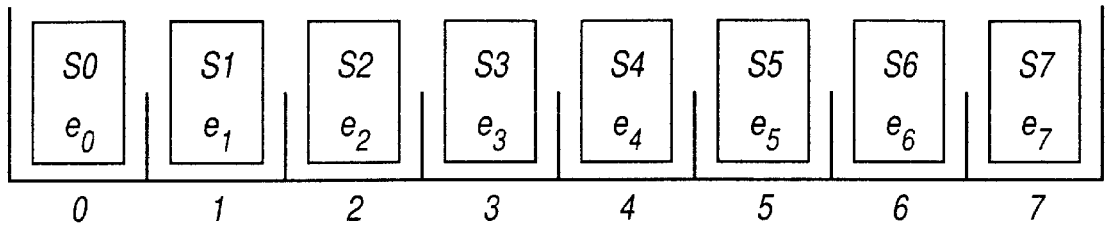
Fig.25(A)   POSITION IN TRANSFER FUNCTION
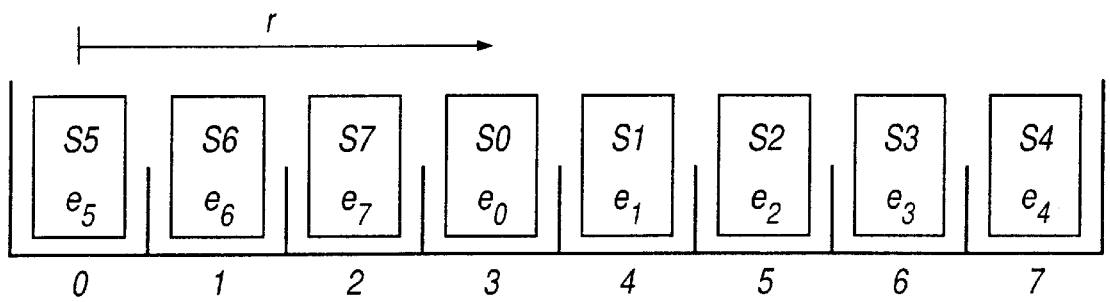
Fig.25(B)   POSITION IN TRANSFER FUNCTION
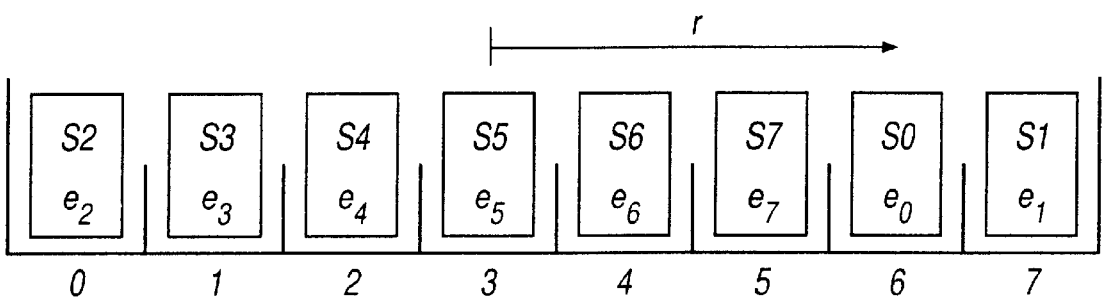
Fig.25(C)   POSITION IN TRANSFER FUNCTION

SEGMENTED CIRCUITRY

BACKGROUND OF THE INVENTION

1. Field of the Invention

The present invention relates to segmented circuitry such as, for example, digital-to-analog converters.

2. Description of the Related Art

FIG. 1 of the accompanying drawings shows parts of a conventional digital-to-analog converter (DAC) of the so-called "current-steering" type. The DAC 1 is designed to convert an m-bit digital input word (D1-Dm) into a corresponding analog output signal.

The DAC 1 includes a plurality (n) of identical current sources $2_1$ to $2_n$, where $n=2^m-1$. Each current source 2 passes a substantially constant current I. The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1-Dm by a binary-thermometer decoder 6. The decoder 6 operates as follows.

When the binary input word D1-Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1-Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1-Dm has the value i, the first i differential switching circuits $4_1$ to $4_i$ select their respective first terminals, whereas the remaining n−i differential switching circuits $4_{i+1}$ to $4_n$ select their respective second terminals. The analog output signal $V_A-V_B$ is equal to $(2i-n)IR$.

FIG. 2 of the accompanying drawings shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr-1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

It will be appreciated that the number of current sources 2 and corresponding differential switching circuits 4 in the FIG. 1 architecture is quite large, particularly when m is greater than or equal to 6. When m=6, for example, n=63, and 63 current sources and 63 differential switching circuits are required. In order to deal with such a large number of current sources, and to enable the thermometer signals to be delivered efficiently to the different differential switching circuits, it has been proposed to arrange the current sources and differential switching circuits as a two-dimensional array of cells, each cell including one current source and its associated differential switching circuit. This arrangement is shown in FIG. 3 of the accompanying drawings.

In FIG. 3, 64 cells $CL_{ij}$ are arranged in an 8×8 square array having eight rows and eight columns. In FIG. 3, the first digit of the suffix applied to each cell denotes the row in which the cell is located and the second digit of the suffix denotes the column in which the cell is located. Thus, the cell $CL_{18}$ is the cell in row 1, column 8.

Each cell $CL_{ij}$ includes its own current source 2 and its own differential switching circuit 4. The respective first terminals of the cells of the array are connected together to a first connection line A of the DAC and the respective second terminals of the cells of the array are connected together to a second connection line B of the DAC, as in the FIG. 1 DAC.

The numbers allotted to the cells $CL_{ij}$ in FIG. 3 denote the sequence in which the cells are activated (or controlled) to change from selecting their respective second terminals to selecting their respective first terminals. The activation sequence follows the physical order of the cells in the array, starting from row 1 and activating the cells of that row sequentially in column order, followed by row 2, and so on for each successive row of the array.

One problem which arises in the FIG. 3 arrangement is that, although the output currents of the respective current sources 2 of the different cells of the array should be uniform, in practice the actual output currents of the cells suffer from non-uniformity arising from various causes.

For example, a voltage drop along a power supply line can cause a graded error along a row or column, as shown in FIG. 4(A) of the accompanying drawings. In this case, the current sources in the first four cells of the row or column concerned may have negative errors, signifying that each of them produces a below-average output current. These negative errors decrease towards the centre of the row or column concerned. The current sources in the remaining cells 5 to 8 of the row or column concerned have respective positive errors, signifying that each of them produces an above-average output current. These positive errors increase from the centre of the row or column to the end.

Thermal distribution inside a chip including the array can cause a symmetrical error within a row or column, as shown in FIG. 4(B) of the accompanying drawings. In this case, the current sources in the end cells 1, 2, 7 and 8 of the row or column have negative errors, whereas the current sources of the central cells 3 to 6 of the row or column have positive errors.

In addition, there can be other types of error such as random errors, discussed in more detail below. The final error distribution for the cell array is produced by superposing all the different error components.

The graded and symmetrical errors shown in FIG. 4(A) and FIG. 4(B) tend to accumulate and result in a large integral linearity error (INL). For example, imagine that the graded error distribution shown in FIG. 4(A) exists within the first row of the cell array shown in FIG. 3. In this case, as cells 1 to 4 are progressively activated (changed from selecting their respective second terminals to selecting their respective first terminals) the negative errors accumulate, amounting to a significant total negative error when the digital input code is 4. Only when cells 5 to 8 are sequentially activated do the positive errors attributable to these cells start to cancel out the large negative error attributable to cells 1 to 4.

Of course the situation is even worse if there are graded errors corresponding to FIG. 4(A) along each of the columns 1 to 8. In this case, as cells 1 to 8 are progressively activated, the largest negative error (the error at position 1 in FIG. 4(A)) occurs for each of the eight cells of row 1. Similarly, in row 2, negative errors corresponding to position 2 in FIG. 4(A) accumulate eight times. Thus, by the time the input code has increased to 32 (corresponding to all of the cells in rows 1 to 4 being activated) the accumulated negative error is very large indeed.

Similar problems arise with the accumulation of symmetrical errors of the kind shown in FIG. 4(B).

Mismatches due to graded and symmetrical errors can be reduced by selecting the cells in a special sequence different from the sequence in which they are arranged physically in the cell array. In particular, a special cell selection sequence conforming to the sequence of numbers in a so-called "magic square" is described in the assignee's U.S. Pat. No. (CPA) 6,236,346, the entire content of which is incorporated herein by reference.

However, even when such a special cell selection sequence is employed, there inevitably remains a mismatch between the respective currents produced by the different segments. This in turn causes non-linearity in the performance of the DAC.

It has been proposed in a paper entitled "Structural Optimization and Scaling of SC Delta-Sigma ADCS", Jesper Steensgaard, Delta-Sigma Data Converters Lecture Course, Mar. 16–19, 1999, San Diego, Calif., to employ element (or segment) rotation to shape mismatches between the elements of a DAC. In this proposal, the elements are rotated using data-directed rotation amounts. Another paper from the same lecture course, entitled "Mismatch-Shaping Multibit DACs for Delta-Sigma ADCs and DACs, Ian Galton, discloses mismatch shaping techniques which move noise from low frequencies to high frequencies to improve the noise shape. In these techniques the noise increases rapidly with frequency at high output-signal frequencies, so large oversampling ratios (e.g. 8 or 25) must be used to obtain useful results. A further paper from the same lecture course, entitled "Unconventional Applications of Noise-Shaping Techniques", Bob Adams, discloses that element "scrambling" can be employed in a sigma-delta DAC to turn distortion into shaped noise. The scrambling can be either random, which distributes the noise evenly across the entire frequency spectrum both within and outside the desired range of frequencies of the output signal, or data-directed which moves the noise away from DC but has noise that increases in amplitude progressively with frequency.

A technique has also been proposed, in the assignee's European patent publication no. EP-A-1100203 (corresponding to the assignee's co-pending U.S. patent application Ser. No. 09/708677), the entire content of which is incorporated herein by reference, which employs segment rotation, by amounts which are not data-directed, to shape mismatches between the segments of a DAC in order to shift noise out of a particular band of interest.

The above-described techniques are employed in order to overcome or alleviate the problems caused by graded, symmetrical and random errors in the segment sources of a particular device. However, there still remains a significant variation in performance from one device to the next due to the random source mismatches, as will now be described in more detail.

FIG. 5(A) of the accompanying drawings is a graph in which line S illustrates how an analog output signal varies with the binary input signal D1-Dm in an example bipolar DAC device. Line L1 represents the ideal input-output behaviour in such a device, where the analog output accurately follows the digital input in a linear fashion. As described above, in a real device various errors are inevitably present which cause the actual output analog signal to depart from ideal (line L1), as follows. The errors have been exaggerated for the purposes of this illustration.

An offset error causes the idealised output signal represented by line L1 to shift up by a certain amount $E_O$ for all digital input values, as illustrated by line L2. A gain error alters the gradient of the response curve to cause the offset error line L2 to rotate by an amount $E_G$ as illustrated by line L3. Finally, residual errors such as random errors, arising from source mismatches, cause the actual analog output signal to depart from line L3 by residual (random) error amounts $E_R$ which vary as the binary input signal varies. The lines L1, L2 and L3 are of course artificial representations used for the purposes of this explanation, with the line L3 drawn so as to pass through the actual analog output signal values (A and D in FIG. 5(A)) at the extremities of the digital input range.

FIG. 5(B) of the accompanying drawings is a plot corresponding to FIG. 5(A) but showing the difference in output-signal value between lines S and L3 in FIG. 5(A) as the digital input signal is varied. Thus, the plot of FIG. 5(B) represents graphically the extent of the departure of the actual output signal of FIG. 5(A) from linearity; FIG. 5(B) does not take into account the offset and gain errors $E_O$ and $E_G$ mentioned above. The plot in FIG. 5(B) therefore shows the departure from the artificial linearity represented by line L3 which is constructed so as to be coincident with line S at points A and D, and not the departure from the ideal linearity represented by line L1. The plot in FIG. 5(B) also returns to zero at points B and C where the line S crosses line L3.

Such a plot as that in FIG. 5(B) for a particular DAC device is referred to herein as the "transfer function" of the device. Since the horizontal axis represents a digital input signal incrementing by discrete steps, the transfer function actually varies in a stepwise fashion.

An equation defining the transfer function (non-linearity error) E can be derived by considering the FIG. 1 DAC in more detail. Although the n current sources $2_1$ to $2_n$ ideally generate identical currents I, in practice the current sources will have respective current errors $e_1$ to $e_n$ which may be positive, negative or zero. The DAC of FIG. 1 has a differential output signal $I_A$–$I_B$, where for a digital input-signal value (D1-Dm) of x:

$$I_A = \sum_{i=1}^{x} (I + e_i)$$

$$I_B = \sum_{i=x+1}^{n} (I + e_i)$$

with associated errors $E(I_A)$ and $E(I_B)$ given respectively by:

$$E(I_A) = \sum_{i=1}^{x} e_i$$

$$E(I_B) = \sum_{i=x+1}^{n} e_i$$

such that the overall error E(I) is given by:

$$\mu = \left(\sum_{i=1}^{n} e_i\right) / n$$

In this expression for the error E(I), the offset error $E_O$ described above with reference to FIG. 5(A) has been ignored. The gain error $E_G$ described above with reference to FIG. 5(A) can also be eliminated from this expression for E(I) by considering the mean $\mu$ of the errors $e_1$ to $e_n$:

$$E(I) = E(I_A - I_B) = E(I_A) - E(I_B) = \sum_{i=1}^{x} e_i - \sum_{i=x+1}^{n} e_i$$

A non-zero value of the mean $\mu$ for a device causes the gain error $E_G$ described above with reference to FIG. 5(A), since every current source contributes, on average, an error of $\mu$ to the line A or B to which it is connected, resulting in an overall change in the slope of the input-output response. The gain error $E_G$ can be eliminated from the expression for the error E(I) by subtracting the mean error $\mu$ from each of the current source errors $e_i$ as follows.

The sum of the errors (relative to the mean error $\mu$) of current sources $2_1$ to $2_x$ connected to line A is:

$$E_A = \sum_{i=1}^{x} (e_i - \mu)$$

Similarly, the sum of the errors (relative to the mean error $\mu$) of current sources $2_{x+1}$ to $2_n$ connected to line B is:

$$E_B = \sum_{i=x+1}^{n} (e_i - \mu)$$

Thus, the transfer function E can be expressed as:

$$E = E_A - E_B$$

$$E = \sum_{i=1}^{x} e_i - x\mu - \left(\sum_{i=x+1}^{n} e_i - (n-x)\mu\right)$$

$$E = \sum_{i=1}^{x} e_i - \sum_{i=x+1}^{n} e_i + (n - 2x)\mu$$

When x=0, all of the errors $e_1$ to $e_n$ are connected to line B which means that $E_A$ is zero. $E_B$ is also zero because by definition the sum of the line-B errors $e_1$ to $e_n$ is simply equal to n times the mean error $\mu$. Thus, E=0 as represented by point A in FIG. 5(B).

Similarly, when x=n, all of the errors $e_1$ to $e_n$ are connected to line A which means that $E_B$ is zero. $E_A$ is also zero because the sum of the line-A errors $e_1$ to $e_n$ is by definition $n\mu$. Thus, again E=0 as represented by point D in FIG. 5(B).

For all other values of x, the errors will be connected in different combinations to lines A and B with the result that the transfer function E is in the form of a "random walk" which always starts and ends at zero and can be positive, negative or zero at points in between.

When the input value changes from x−1 to x, the current source $2_x$ changes from being connected to line B to being connected to line A, increasing $E_A$ by $(e_x-\mu)$ and decreasing $E_B$ by $(e_x-\mu)$. Thus, each step in the random walk of the transfer function E is 2 $(e_x-\mu)$.

Accordingly, the transfer function E can be regarded as the accumulated current-source errors, relative to the mean current-source error, for the particular DAC device. Choosing to make E zero at x=0 and n is simply equivalent to choosing to draw a line L3 through the actual output-signal values at points A and D in FIG. 5(A).

The transfer function causes unwanted distortion in the output of a DAC, to varying degrees and effects according to the exact shape of the transfer function. For example, a transfer function of the form shown in FIG. 6(A), which bows upwards (or downwards) in a single arc, will lead to the generation of unwanted second harmonics in the output signal. A transfer function of the form shown in FIG. 6(B), which is an S-shape passing through the zero-error axis at or near the mid-point, will lead to the generation of unwanted third harmonics in the output signal.

The current-source errors $e_i$ conform to a Gaussian (or normal) distribution. When DAC devices are manufactured the transfer functions E of the manufactured devices will also differ one from the next in accordance with the Gaussian distribution of current-source errors.

FIG. 7(A) of the accompanying drawings shows the transfer functions of six example DACs. In each individual DAC device the current source errors conform to a Gaussian distribution, and the current-source error distribution will be similar from one device to the next but with some deviation between devices, as shown in FIG. 7(B) of the accompanying drawings. The more segments there are in each device, the more similar the current source error distributions of different devices will be, but since the errors will be arranged (or selected) in a different order from one device to another, the transfer function of one device will almost always be different from that of another.

As a result of the fact that the transfer function differs from device to device, so too will the distortion in the output signal differ from device to device under the same input signal conditions. For example, for a DAC generating as its output signal a 100 MHz sine wave, the second harmonic would be a discrete tone at 200 MHz with a typical amplitude of, for example, −55 dBc (i.e. −55 dB relative to the main signal). However, since the transfer function is not the same from device to device as explained above, the amplitude of this second harmonic will typically vary from device to device by up to ±10 dB. Other distortion components caused by the non-linear output response of the device will also vary from device to device by a similar magnitude.

This device-to-device performance variation of several dB either side of typical has important consequences in terms of the manufacturing yield which can be achieved for the device.

From the point of view of the manufacturer of the devices, an assessment needs to be made of a trade-off between device yield and guaranteed minimum device performance (for example, a minimum signal-to-noise ratio in a particular frequency band of interest). Device-to-device performance variation means that the minimum performance must be specified as several dB worse than typical. One implication of this is that production testing and screening is required. Even allowing for some yield loss to reject the worst devices, the specification has to be reduced. Based on well-known device yield curves, it is known, for example, that if a guaranteed minimum noise performance figure is quoted based on a "mean-2$\sigma$" figure (produced by subtracting twice the standard deviation $\sigma$ from the mean value), approximately 97% of manufactured devices will meet or exceed the guaranteed performance, i.e. the yield will be 97%.

If, instead of using a "mean-2$\sigma$" figure, the manufacturer quotes the guaranteed performance based on a more modest "mean-3$\sigma$" figure, the yield will increase to 99.9%, making the unit cost lower, but of course the quoted performance will also be lower, making the device less attractive to customers. If the manufacturer quotes the guaranteed performance based on a more demanding "mean-3$\sigma$" figure, the yield will drop to approximately 84%, raising the unit cost, but the quoted performance will be higher, making the device more attractive to customers. The "mean-2$\sigma$" figure is often a sensible trade-off, in that it gives an attractive performance level for customers whilst keeping the yield desirably high so that the unit cost is economic.

It is therefore desirable from the manufacturer's point of view to reduce a device-to-device performance variation caused by differing transfer functions, so as to permit a better minimum performance to be specified by the manufacturer and/or an improved yield for a given minimum performance level.

In practice, it can often be difficult to assess the effects of using the above-mentioned techniques on the distortion components caused by segment mismatches, and empirical checks may be desired in order to select the most appropriate parameters to suit a particular application, or alternatively to test that the desired effect is being achieved by a particular set of parameters. It is therefore desirable to provide a means of facilitating the empirical selection or confirmation of such parameters.

SUMMARY OF THE INVENTION

An embodiment of one aspect of the present invention provides mixed-signal circuitry which is operative to perform a series of operation cycles. n circuitry segments together produce an analog output signal. Control signal generating circuitry is operable in each cycle to generate, in dependence upon a digital input signal, a set of n segment control signals for application to respective ones of the segments to influence the produced analog output signal. Morphing circuitry causes the n segment control signals to be applied to the n segments in at least two different orders at different respective times. At least one order differs from the next order by more than a starting ordinal position amongst the segments and that the changes in ordinal position of the segments brought about by the changes in order of application of the segment control signals are limited in number and/or magnitude relative to the number n of segments.

An embodiment of another aspect of the present invention provides a noise shaping method for use in such mixed-signal circuitry.

There are many different ways in which the number and/or magnitude of the ordinal position changes can be limited.

In terms of numbers of segments, in one embodiment, for each change in order there is at least one segment that is not changed in ordinal position. In another embodiment, for each change in order at least n/16 segments are not changed in ordinal position. In other embodiments, the numbers of segments changing are limited further still. For example, for each change in order at most n/2 segments may have a change in ordinal position, or at most a pair of segments may change ordinal position.

It is also possible to express the limitation in terms of an overall extent of the changes of ordinal position brought about by each change in order. For example, each change from one order to the next may be considered to have an associated segment change parameter, calculated by summing over all n segments the respective ordinal position changes, if any, brought about by the change in order concerned. The limits may then be expressed in terms of the values of the segment change parameters. In one embodiment the respective segment change parameters associated with the changes in order are each less than $n^2/4$, more preferably each less than or equal to 16 n, and more preferably still each less than 2 n. In another embodiment an average value of the segment change parameter per cycle is less than $n^2/64$, more preferably less than 16 n, and more preferably still less than 2 n. In another embodiment a difference between respective minimum and maximum values of the segment change parameter is limited relative to the number n of segments. For example, the difference may be less than $n^2/64$, more preferably less than 16 n, and more preferably still less than 2 n. It may even be zero.

In practice, to keep complexity down the order of application of the segment control signals to the segments in any one cycle is preferably selected from among a plurality of predetermined available orders. The total number of predetermined available orders is preferably greater than 4, more preferably greater than n. The higher the number of available orders the greater the reduction in transfer function variation.

Each one of the predetermined available orders may be selected in turn in a predetermined order but preferably, to reduce the magnitudes of the noise components (whilst spreading them out), each one of the available orders is selected on a random or pseudo-random basis. In one embodiment, changes in order that involve more limited overall changes in ordinal position are caused to occur on average more often than changes in order that involve greater overall changes in ordinal position. This helps to keep a limit on the variation in value of the segment change parameter. In another embodiment the predetermined available orders are such that all changes in order involve approximately the same overall changes in ordinal position, i.e. approximately the same value of segment change parameter, and all changes in order are caused to take place on average with approximately the same frequencies.

One preferred way of changing the orders without making the circuitry too complex, and without the overall changes in ordinal position being too large, is swap the respective ordinal positions of segments belonging to one or more preselected pairs of segments.

An amount by which the noise components are spread out is influenced by an average time interval between repetitions of a given change in order. In one embodiment this average time interval is at least 0.1 µs.

The n segments may be sub-divided into m groups of segments, where m≧2. In one embodiment m=8 or 16 when n=128. When groups are formed the ordinal positions of segments belonging to the same group only may be changed, e.g. swapped. In this case, to limit the numbers of segments that change ordinal position changes in ordinal position may be permitted in m−1 or fewer of the m groups at any one time, for example in only one group at any one time. In order that segments can move to ordinal positions spanning over the range of n possible ordinal positions when the orders are changed, the ordinal positions of segments belonging to the same group are preferably spread out (e.g. evenly) over the range of n possible ordinal positions.

An embodiment of another aspect of the present invention provides segmented circuitry which comprises a plurality of circuitry segments, each having a first analog quantity defining portion which defines a first analog quantity for its segment, and also having a second analog quantity defining portion which defines a second analog quantity for its segment. The second analog quantity is less well-defined than the first analog quantity for the segment concerned. Analog quantity selecting circuitry selects the first analog quantities or the second analog quantities. Combining circuitry produces a combined analog quantity based on the respective selected analog quantities of a combination of the circuitry segments.

The segmented circuitry described above may also be operative to perform a series of operation cycles, and in this case may further comprise control signal generating circuitry which in each cycle generates, in dependence upon a digital input signal, a set of segment control signals for application to respective ones of the segments to influence the combined analog quantity. Noise shaping circuitry causes the segment control signals to be applied to the segments in at least two different orders at different respective times, thereby to convert distortion, caused by mismatches between the first analog quantities of different segments, into noise components at preselected desired frequencies.

In a method of testing this segmented circuitry according to an embodiment of another aspect of the present invention, the analog quantity selecting circuitry is caused to select the second analog quantities, the operating parameters of the noise shaping circuitry, used by the noise shaping circuitry to influence the different orders, are set, and measurements are carried out on a signal derived from the combined analog quantity so as to identify the positions in a frequency spectrum of that signal of the noise components.

BRIEF DESCRIPTION OF THE DRAWINGS

FIGS. 9(A), 9(B) and 9(C) are schematic diagrams illustrating the swapping of segments in an embodiment of the invention;

FIG. 11 is a table summarising the sequence of segment and random error orders illustrated with reference to FIGS. 8 and 9;

FIG. 13 is a table showing the bits associated with eight unique local segment IDs;

FIG. 14 is a table showing the connection arrangement of a segment's local morphing ID inputs to a morphing ID signal bus according to the IDs of FIG. 13;

FIG. 15 is a table showing the bits associated with eight unique local segment IDs when subdivided into seven possible changes;

FIG. 16 is a table showing the connection arrangement of a segment's local morphing ID inputs to a morphing ID signal bus according to the IDs of FIG. 15;

FIG. 23 is a table showing the connection arrangement of a segment's local morphing ID inputs to a morphing ID signal bus;

FIG. 24 is a table showing how intermediate decode bits are produced from the morphing signal;

FIGS. 25(A), 25(B) and 25(C) are schematic diagrams illustrating rotation of segments;

DETAILED DESCRIPTION OF THE PREFERRED EMBODIMENTS

Figure 8:
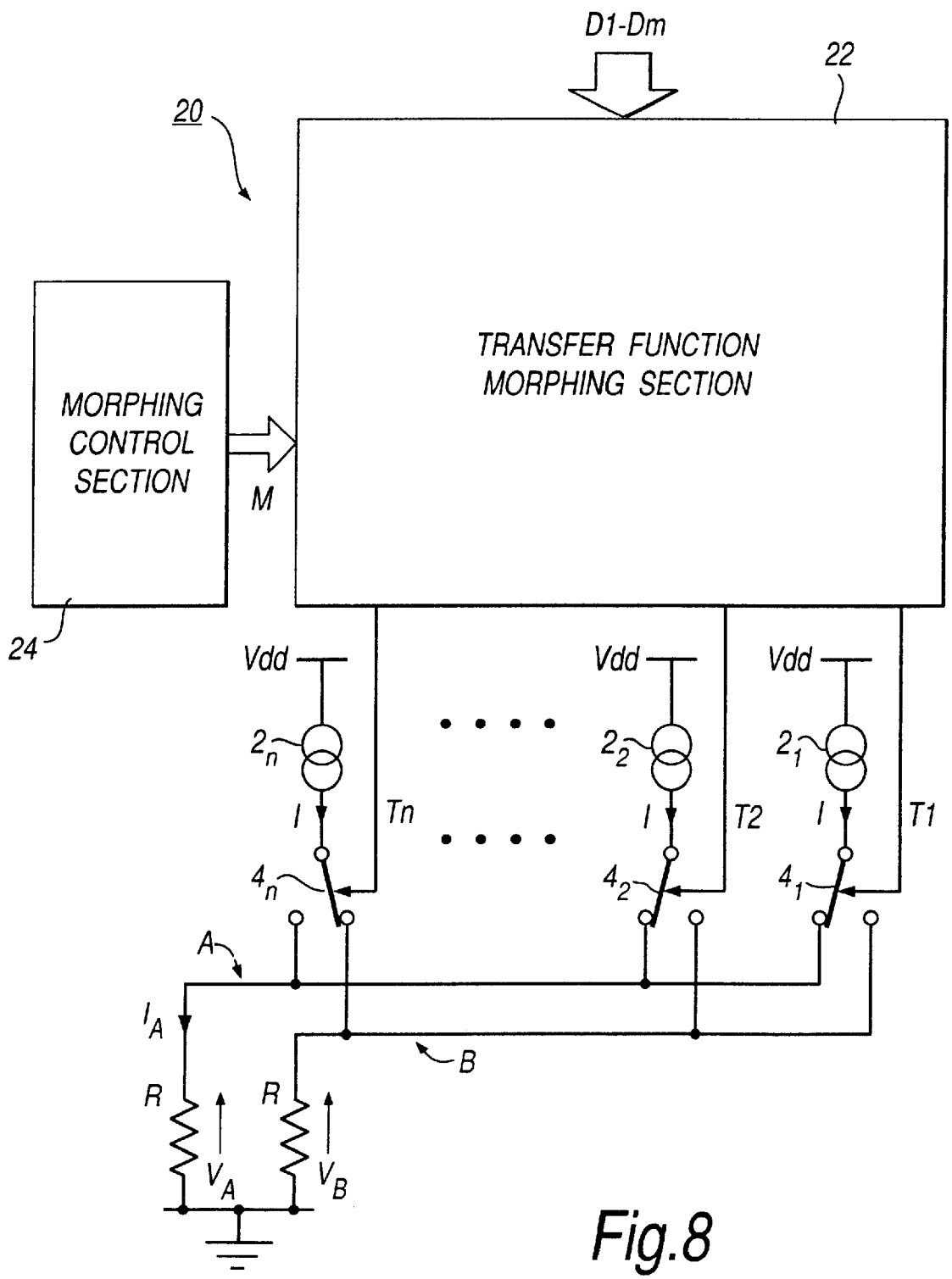
FIG. 8 is a block diagram for use in explaining operation of a DAC embodying the present invention.

FIG. 8 is a block diagram for use in explaining in general terms the constitution and operation of a DAC embodying the present invention. More detailed specific embodiments will be described thereafter. Parts of the FIG. 8 DAC which are the same as, or correspond closely to, parts of the FIG. 1 DAC discussed hereinbefore are denoted by the same reference numerals, and a description of those parts is omitted.

The FIG. 8 DAC includes a digital circuitry portion DC and an analog circuitry portion AC. The analog circuitry portion AC is constituted in the same way as in the FIG. 1 DAC and includes a plurality of segments (or cells), each segment having a constant current source 2 and a switch 4. The switch 4 in each segment is controlled by an individually-corresponding thermometer-coded signal T supplied thereto from the digital circuitry portion DC.

Figures 1, 2:
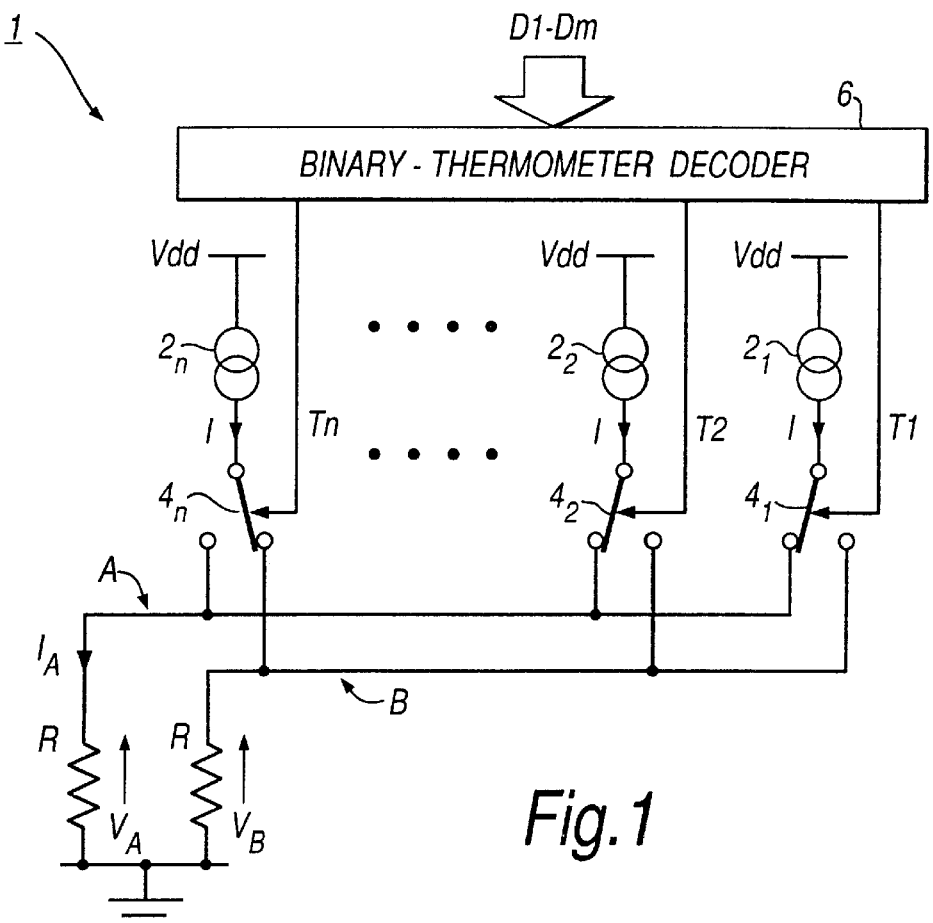
FIG. 1, discussed hereinbefore, shows parts of a previously-considered current-steering DAC.
FIG. 2, also discussed hereinbefore, shows a table for use in explaining how thermometer-coded control signals are derived from a binary input word in the FIG. 1 DAC.

In the FIG. 8 DAC, the digital circuitry portion DC includes a transfer function morphing section 22 and a morphing control section 24. The binary-thermometer decoder 6 of FIG. 1 is not necessary in this embodiment since its function is effectively incorporated into the transfer function morphing section 22, as will be described in more detail below.

The transfer function morphing section 22 has m inputs for receiving the binary input word D1-Dm and n outputs at which respective ones of the thermometer-coded output signals T1 to Tn of the digital circuitry portion DC are generated.

The transfer function morphing section 22 also has a control input connected to an output of the morphing control section 24 for receiving therefrom a morphing control signal M.

Operation of the FIG. 8 DAC will now be described. The DAC performs a series of operation cycles (conversion cycles) at a predetermined operating frequency (sampling rate) $F_{DAC}$. $F_{DAC}$ is, for example, 100 million samples per second (100 Msamples/s).

In each cycle, the transfer function morphing section 22 receives the morphing control signal M to be used in that cycle and converts the externally-applied input word D1-Dm into the n thermometer-coded signals (segment control signals) T1 to Tn in accordance with the received signal M.

The operation of the transfer function morphing section 22 and the morphing control section 24 will now be described with reference to an illustrative example in which the DAC has only 8 segments so as to simplify the explanation.

FIG. 9(A) is a schematic diagram showing the set of eight segments S0 to S7, with each segment being constituted as described above with reference to FIG. 8. The current source 2 within each segment $S_i$ generates a current I having a random current source error $e_i$ associated with it, so that segment Si generates a current of $(I+e_i)$. Shown within each segment of FIG. 9(A) are the segment number and the random current source error associated with that segment.

In the FIG. 8 DAC, as in the conventional DAC of FIG. 1, as the binary input word is increased, the segments are switched over progressively from line B to line A in order, i.e. the differential switch $4_i$ in that segment switches the current $(I+e_i)$ from line B to line A. However, in the FIG. 8 DAC the order of the segments can be changed at predetermined time intervals, for example every conversion cycle, by the transfer function morphing section 22 so that in one conversion cycle the segments switch over in a first predetermined order and in another conversion cycle the segments switch over in a second predetermined order different from the first order.

The segment order is controlled by the morphing control section 24 by applying the morphing control signals to the transfer function morphing section 22. The morphing signal M can, for example, be an indication of the absolute order to be used, or it can be an indication of how the order is to change relative to the previous conversion cycle. In each conversion cycle, the transfer function morphing section 22 then decodes the received binary input word (digital input signal) D1-Dm and applies the thermometer-coded output signals T1 to Tn to the differential switches 4 in accordance with the morphing control signal M so as to arrange the segments in the order indicated by that signal.

As described in the introduction, the corresponding respective random source errors $e_0$, $e_1$, $e_2$, $e_3$, $e_4$, $e_5$, $e_6$ and $e_7$ influence the transfer function (non-linearity error) according to the order in which they are arranged to switch over.

Initially, as shown in FIG. 9(A) itself, the segments are initially in the order S0, S1, S2, S3, S4, S5, S6 and finally S7. The transfer function E resulting from the initial segment order shown in FIG. 9(A) is schematically illustrated by line E1 in FIG. 10(A). In this example the magnitudes of the illustrated errors $e_0$ to $e_7$ relative to the mean error $\mu$ are assumed to be as follows: $e_0=\mu+1$, $e_1=\mu+1.5$, $e_2=\mu-1$, $e_3=\mu-0.5$, $e_4=\mu+1$, $e_5=\mu-3$, $e_6=-0.5$ and $e_7=\mu+1.5$. As can be seen from FIG. 10(A), as the input signal value increases from negative full scale (NFS) to positive full scale (PFS) the segments are switched over in order, the accumulated error (transfer function) steps up or down by an amount according to twice the random current-source error (relative to the mean error $\mu$) associated with the segment being switched over, so that when, for example, segment S1 is switched over the transfer function changes by $2(e_1-\mu)$ (a rise of 3 in this example). When segment S5 is switched over, the transfer function changes by $2(e_5-\mu)$ (a fall of 6 in this example).

The order of segments for the first cycle of this illustrative example is summarised in the first of the two columns entitled "First conversion cycle" in the table of FIG. 11.

Figure 6A:
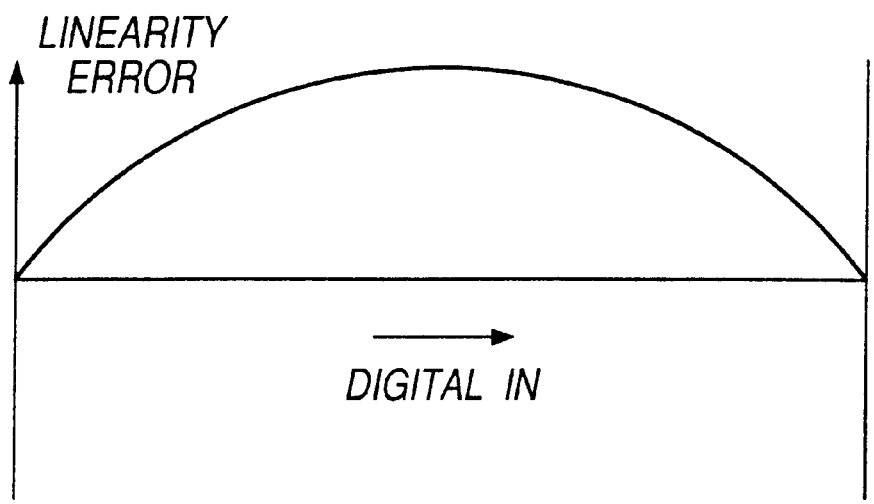
FIGS. 6(A) and 6(B), also discussed hereinbefore, show two example device transfer functions.
Figure 6B:
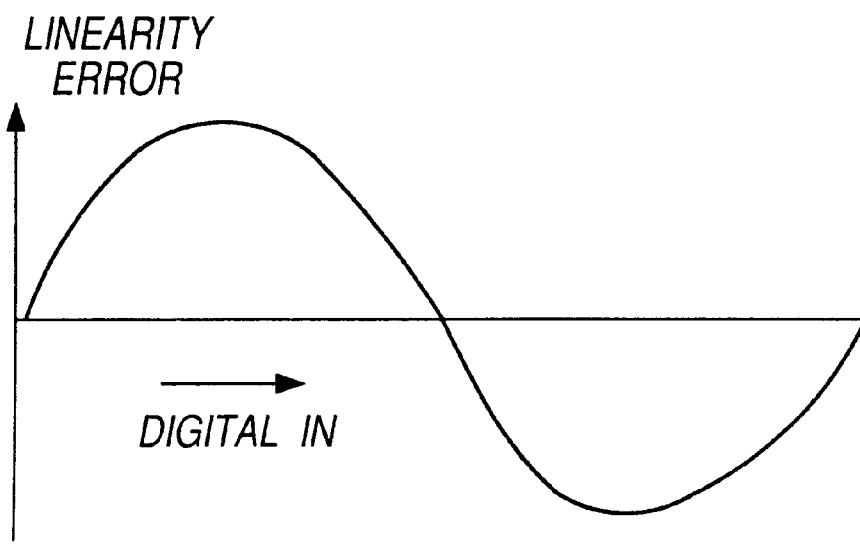
Figure 7A:
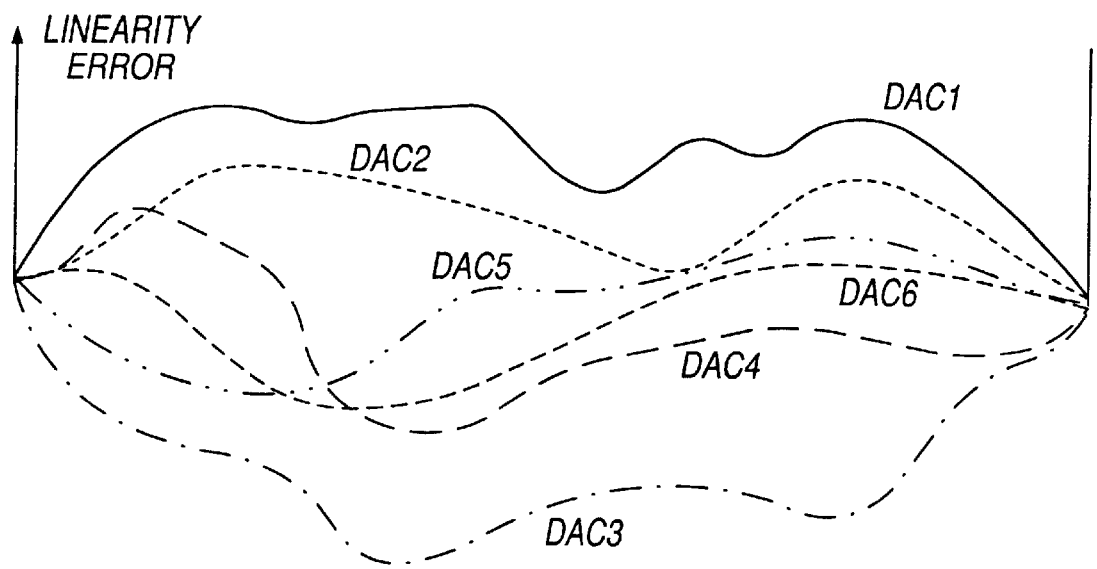
FIGS. 7(A) and 7(B), also discussed hereinbefore, are graphs for use in explaining the variation in transfer function from device to device.
Figure 7B:
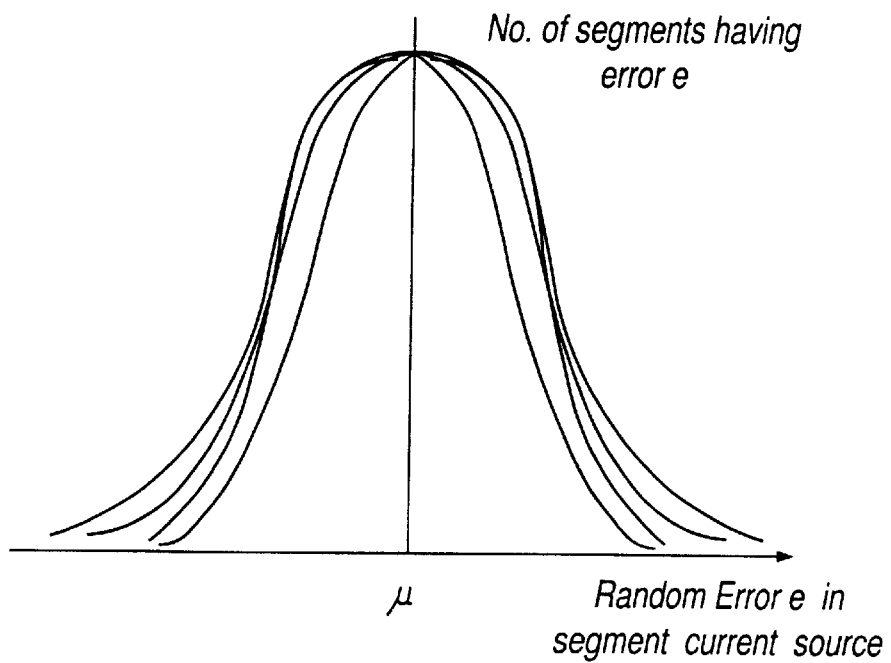

In this example, before the next conversion cycle the morphing control section 24 sends a morphing control signal M indicating that, compared to their ordinal positions in the original order, segments S1 and S5 are to be swapped so that the segments are switched in a new order (second order) as illustrated in FIG. 9(B). This has the effect of changing the order in which the random source errors are selected, as shown in the first of the two columns entitled "Second conversion cycle" in the table of FIG. 11. The change in the order of selection of the random source errors results in a different "random walk" of the accumulated error (transfer function E), as illustrated by line E2 in FIG. 10(B). In the second conversion cycle, the large negative source error of segment S5 ($e_5=\mu-3$) is applied much earlier in the range of input values than in the previous cycle, resulting in a profile which looks substantially different, dipping below zero early on and remaining negative for the rest of the input value range. In this regard, the transfer function E2 of the DAC in the second cycle is similar to the form of transfer function described above with reference to FIG. 6(A), whereas the transfer function E1 of the DAC in the first cycle is more similar to that described above with reference to FIG. 6(B).

Finally, in the third conversion cycle the morphing control section 24 sends a morphing control signal M indicating that, compared to their segment positions in the second order, segments S2 and S4 are to be swapped as illustrated in FIG. 9(C). This again has the effect of changing the order in which the random source errors are selected, as shown in the first of the two columns entitled "Third conversion cycle" in the table of FIG. 11, resulting in the transfer function illustrated schematically by line E3 in FIG. 10(C).

Figure 10A:
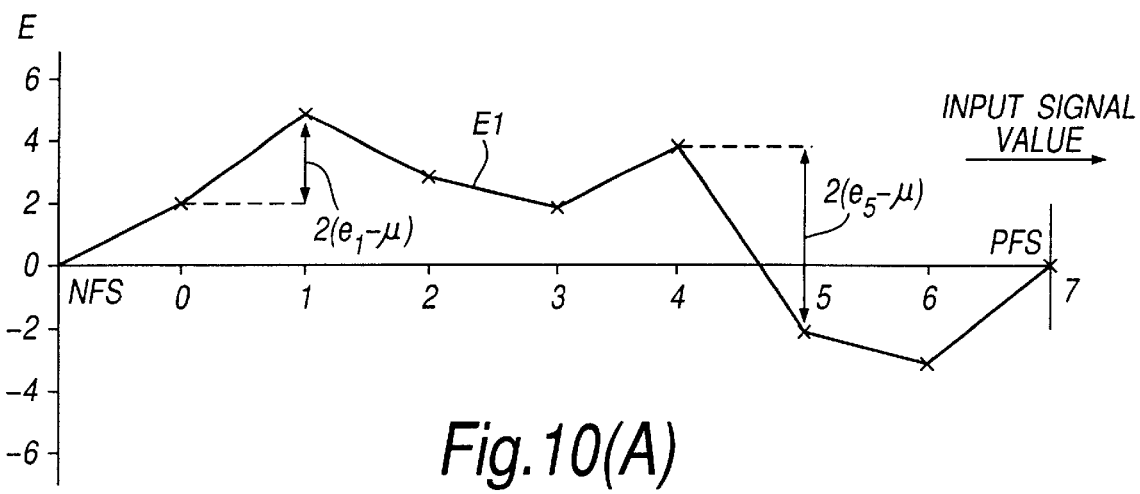
FIGS. 10(A), 10(B) and 10(C) illustrate schematically transfer functions corresponding to the segment arrangements of FIGS. 9(A), 9(B) and 9(C) respectively.
Figure 10B:
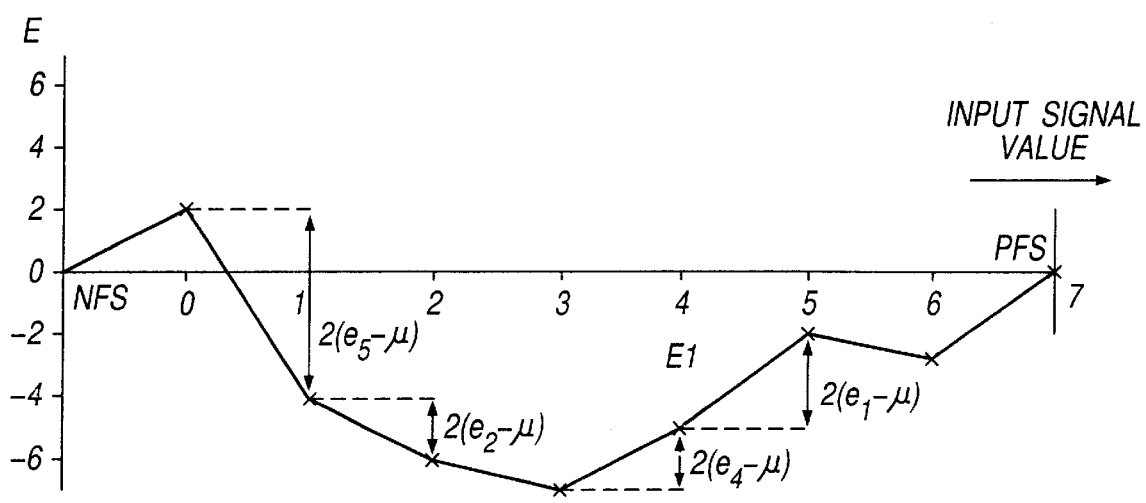
Figure 10C:
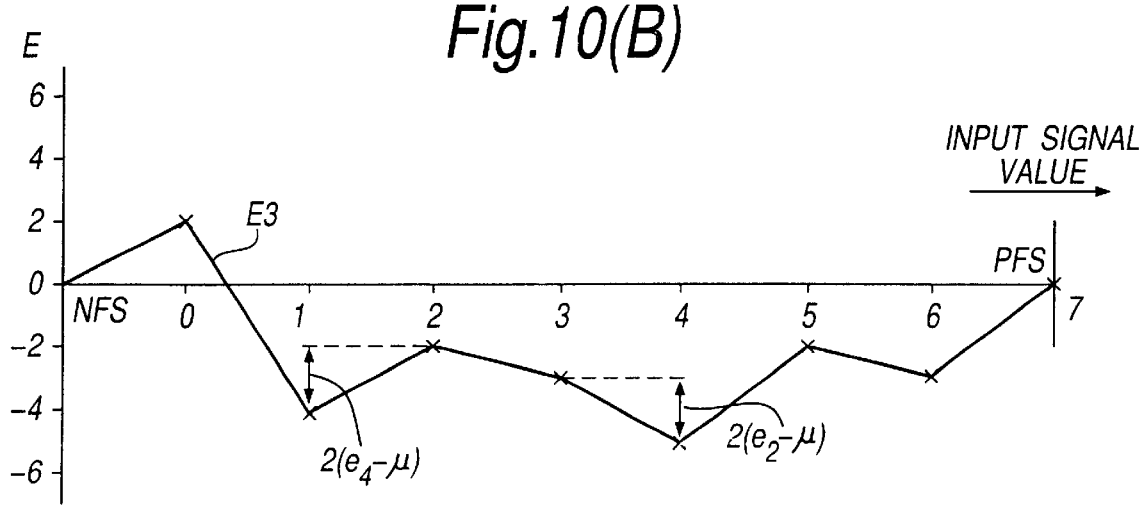

Although the three transfer functions E1 to E3 illustrated in FIGS. 10(A) to 10(C) relate to the same device in three different respective cycles, they could alternatively be considered as relating to three different respective DACs, each having the same distribution of random source errors but arranged in a different order. The above-described swapping of segment orders has the effect of "morphing" the transfer function of a single DAC from one shape to another.

Consider two separate DACs having eight segments with the same set of random source errors associated with their segments, but laid out in a different physical order on the chip. With no morphing being performed as described above, the transfer functions of the two devices will be different. For example, suppose that the first device has the set of random source errors selected in the order shown in FIG. 9(A), and the second device has the same set of random source errors selected in the different order shown in FIG. 9(B). The first device will have a transfer function of the form shown in FIG. 10(A), whilst the second device will have a transfer function of the form shown in FIG. 10(B). Since, as mentioned above, the transfer function of the first DAC is similar to the form of transfer function described above with reference to FIG. 6(B), while the transfer function of the second DAC is more similar to that described above with reference to FIG. 6(A), it may be expected that the second DAC will exhibit greater second harmonic distortion than the first DAC.

By performing the above-described "morphing" operations in each device such that the segments are arranged over time in two or more different orders in each DAC, the transfer function of the DAC will change over time to have two or more different forms. As a result, each DAC has an effective transfer function dependent on an average of the two or more different forms. Because of this averaging, the two DACs will tend to have more similar distortion performances. The higher the number of different segment orders used the greater the convergence of the distortion performances.

The transfer function morphing technique has been described illustratively above with reference to FIGS. 9(A) to (C) and 10(A) to (C) in relation to the current source mismatches which are inevitably present in a real DAC. These current source mismatches contribute in each conversion cycle to an error in the amplitude of (and hence distortion in) the output signal. In fact, the segments also have time delay mismatches associated with them, in addition to the current amplitude mismatches. These delay mismatch errors can be considered to alter the shape of the transfer function by contributing to a horizontal (rather than vertical) deviation in the points on the transfer function. The morphing technique is also effective in reducing the distortion due to these delay mismatches (which tend to become more significant as the sampling frequency increases).

When the number of segments is as small as eight, the distribution of random source errors will actually vary significantly from device to device. As a result, for two selected devices it is unlikely that the same set of current source errors will be present as just described, so that the morphing operation will not in general make the effective transfer functions look entirely the same.

However, since the errors are drawn from a Gaussian distribution, as the number of segments in the devices increases, the distributions of the source errors in different devices will become progressively more similar. This is because, in statistical theory, if a parent population has a mean $\mu$ and a standard deviation $\sigma$, then the sample means constitute a population with mean $\mu$ and standard deviation $\sigma/\sqrt{n}$ of approximately Gaussian form (for large n), and the sample variances constitute a population with mean $\{(n-1)/n\}\sigma^2$. Therefore, when n is large, the distributions converge.

As a result, when the number of segments is large (e.g. more than 16, and preferably 128 or more), and the transfer function in each of the devices is morphed through many different forms in that device (e.g. more than 16, and preferably n or more), the overall effective transfer functions of different devices can be made to look very similar. This has the effect of reducing the performance variation from device to device, which as mentioned above is desirable to achieve in view of the effect it has on improving the manufacturing yield of the device for a given minimum performance requirement or improving the guaranteed minimum performance for given yield. For example, if the transfer function is morphed over 128 different forms then a particular distortion component exhibiting a device-to-device variation before morphing of ±10 dB can be expected to exhibit a device-to-device variation after morphing of approximately $1/\sqrt{128}$ times that variation, or ±1 dB.

Note that this effect is different to the rotation technique and the "magic square" technique described above. When the segment selection order is rotated from cycle to cycle, this has the effect of shifting the starting-point along the transfer function (starting ordinal position of the segments), whilst still selecting the errors in the same order and hence keeping the same overall transfer function profile of the device. Each device will still, therefore, have a different transfer function to that of another device. In the "magic square" technique, the segments are always selected in the same order, albeit different to the physical order on which they are laid down on the chip, so that the transfer function of a particular device is static and will vary from device to device.

The effect of morphing is to take discrete distortion components (e.g. harmonic distortion) which vary from device to device (e.g. by ±10 dB) and change those components into a narrowband noise-like signal at the same frequency, but with a much smaller variation from device to device. The remaining variation will depend upon the number of segments and the manner in which they are reordered, but will typically be at least 10 times smaller. For example, for a DAC generating a 100 MHz sine wave, the second harmonic would be a discrete tone at 200 MHz with a typical amplitude of, for example, −55 dBc (i.e. −55 dB relative to the main signal), but with a range of −45 dBc to −65 dBc across different devices. If the effective transfer function is morphed through many possible forms over a 1 $\mu$s period, then the second harmonic will appear as noise at about 200 MHz with a spread in frequency (i.e. the ±3 db points) of approximately ±$\{1/1\ \mu s)\}$ or ±1 MHz and an energy of −55 dBc typical, with a range of, for example, −54 dBc to −56 dBc over all devices.

The transfer function should preferably be changed relatively slowly because the transfer function is being modulated, which causes the distortion components to spread out in frequency. If the rate of change of the transfer function is too high then these can spread into a desired signal band. If the rate of change is too slow then the instantaneous distortion will simply be seen changing slowly over time. A rate of change in between these two extremes is therefore desirable. Large step changes in the transfer function are also undesirable since these would cause sudden jumps in the output signal, which in turn cause wideband noise.

Figure 3:
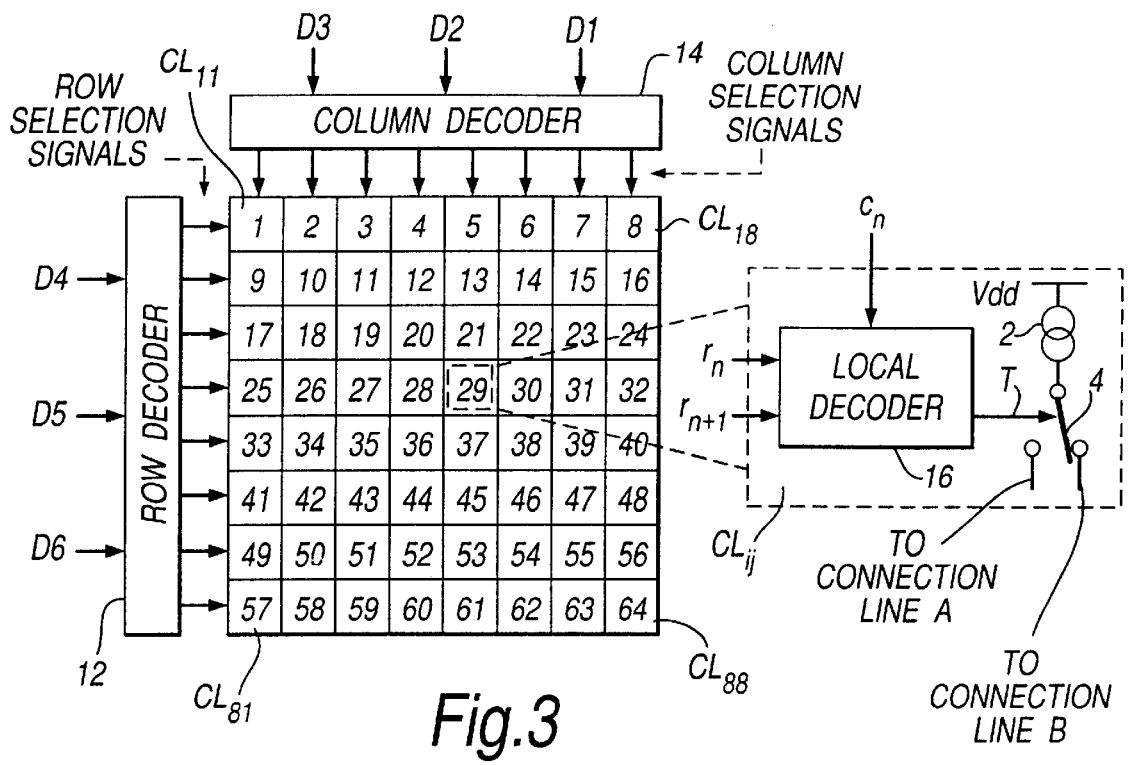
FIG. 3, also discussed hereinbefore, shows parts of cell array circuitry previously considered for use in a DAC.
Figure 4A:
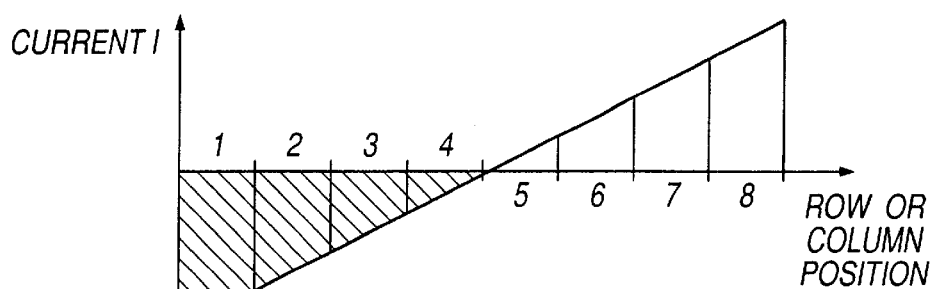
FIGS. 4(A) and 4(B), also discussed hereinbefore, are schematic diagrams for use in explaining the occurrence of graded and symmetrical errors in the cell array circuitry of FIG. 3.
Figure 4B:
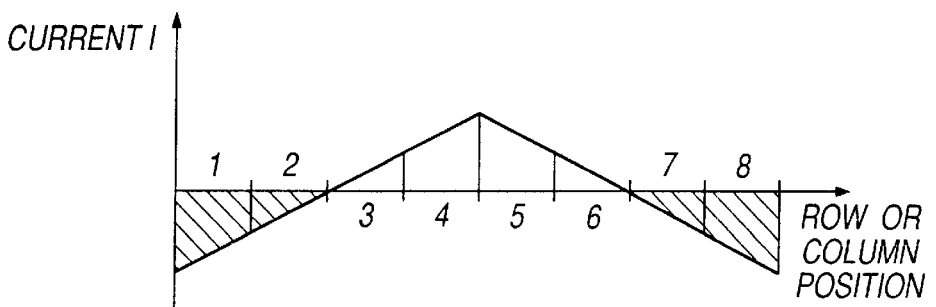
Figure 5A:
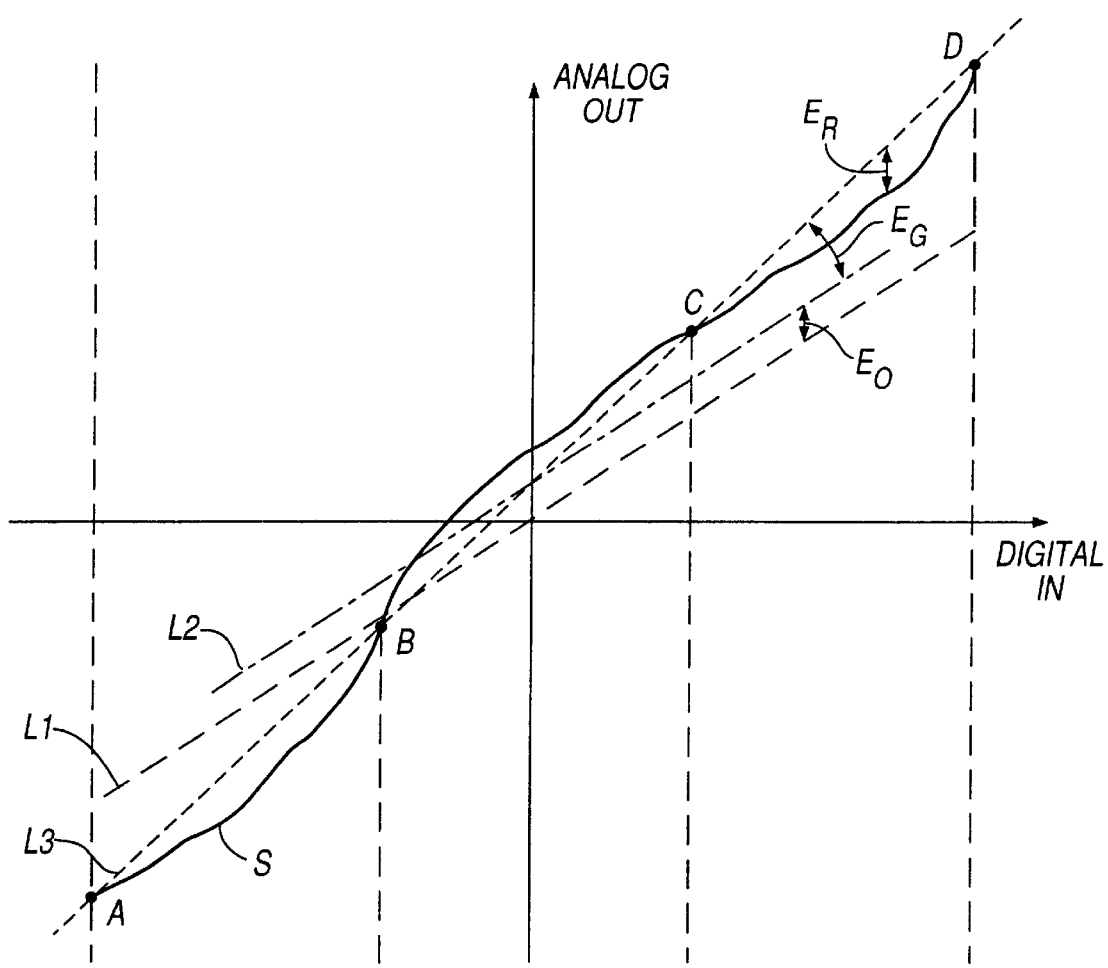
FIGS. 5(A) and 5(B), also discussed hereinbefore, are graphs for use in explaining the occurrence of random source errors in the cell array circuitry of FIG. 1 and FIG. 3.
Figure 5B:
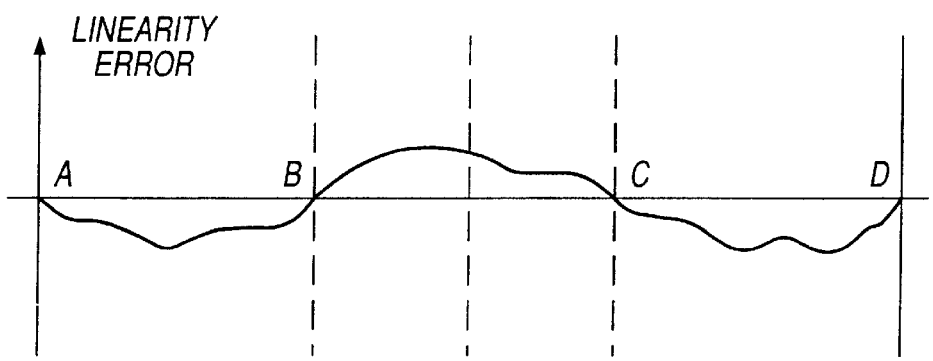

Slow morphing differs from changing the transfer function rapidly and/or by large steps, even if only occasionally, (for example, by employing segment shuffling in which, say, the segments are shuffled quadrant-by-quadrant in the array of FIG. 3) which turns distortion into wideband noise, because slow morphing only spreads the distortion out into a narrow band.

There will now be described with reference to FIG. 12 one possible constitution of the transfer function morphing section 22 described above with reference to FIG. 8.

Figure 12:
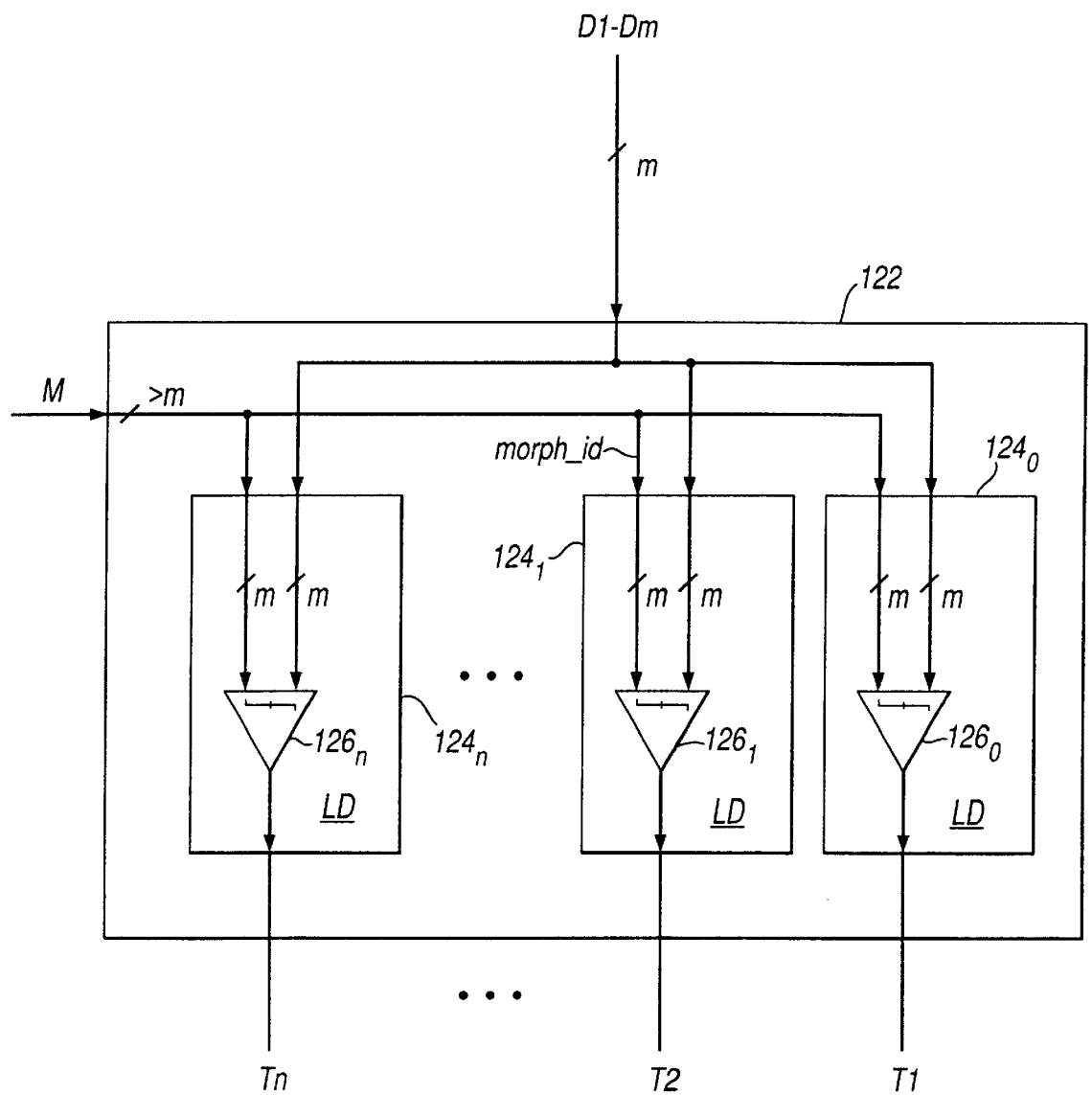
FIG. 12 is a block diagram showing an example of a transfer function morphing section in one embodiment of the present invention.

The transfer function morphing section 122 of FIG. 12 comprises eight local decoders $124_0$ to $124_7$. Each local decoder 124 has two inputs, the first for receiving the morphing control signal M described above with reference to FIG. 8, and the second for receiving the binary input word D1-Dm. Each local decoder outputs one of the n thermometer-coded signals (segment control signals) T1 to Tn shown in FIG. 8.

Each local decoder 124 comprises a comparator 126 having two inputs. The comparator 126 receives at its two inputs the binary input word D1-Dm applied to the second input of the local decoder and a morph_id signal containing certain bits, different for each local decoder, selected from the morphing control signal as will be described below, and outputs a thermometer-coded signal T for its segment.

Operation of the example DAC having a transfer function morphing section 122 as shown in FIG. 12 will now be described. In this example it will be assumed that the number n of segments is 8 for the sake of simplicity, but it will be appreciated that with suitable modifications the concept can readily be applied to a DAC having more than 8 segments. In this example, since there are 8 segments, the binary input word D1-Dm is 3 bits wide, as are the morph_id signals mentioned above.

As can be seen from a comparison of FIG. 12 with that of FIG. 1, in this example the decoding of the binary input word D1-Dm into thermometer-coded signals T1-Tn is not done "globally" (by a centralised binary-to-thermometer decoder such as the decoder 6 in FIG. 1) but instead is performed locally within each of the n segments, as will be described in detail now.

Each of the 8 segments is assigned a unique ID (local ID) chosen from one of the values 0 to 7 (according to the morph_id signal applied to the segment), and this unique ID is compared by the comparator 126 with the binary input word D1-Dm to determine the state of the differential switch 4 for the segment concerned. In this example, if the binary input word is greater than the ID, then the output of the comparator (T) is high (1), which causes the switch 4 to connect the current source 2 to line A (hereinafter the "ON" state).

When such a greater-than comparator 264 is used in each of the 8 segments as described above, one of the segments (the segment for which ID=7) is always in the OFF state (T=0) in any cycle, since the binary input word can never be greater than 7. To maintain a zero offset (taking into account the differential current-switching nature of the switching circuitry), an extra "dummy" segment is included which is maintained to be always in the ON state (T=1). This is more convenient than using only 7 segments. If a greater-than-or-equal comparison were instead performed by the comparator, then one of the segments (the segment for which ID=0) would always be in the ON state (T=1), so that the extra "dummy" segment would instead need to be maintained in the OFF state (T=0) to achieve a zero offset.

As mentioned above, the segments have IDs in the range from 0 to 7. Therefore each segment whose ID is less than the binary input word will have its thermometer-coded signal T set to 1. All other segments will have their thermometer-coded signals set to 0. In this example, therefore, the set of comparators 126 performs the same basic function as the binary-thermometer decoder 6 of the FIG. 1 DAC.

With this arrangement, it is now possible easily to change the order of segment selection (segment ordinal positions) simply by changing the ID assigned to each segment using the morph_id signal.

With changeable local IDs, it must be ensured that at any one time each of the eight local decoders 126 has allocated to it a unique ID, chosen from the set as shown in the table in FIG. 13. Each ID is a three-bit binary number having bits labelled (from least to most significant) B0, B1 and B2. One way to ensure that each local decoder has a different ID allocated to it is to maintain and change a single 3-bit master code, and to route these 3 bits, plus their respective inverses, to the local decoders. These six bits form the morphing control signal M. Each local decoder then picks off just three of these six bits to form its own morph_id signal.

The table of FIG. 14 shows one way in which the six bits of the morphing control signal M can be used by the local decoder for each of the eight segments. For example, morph_id for segment 0 is a three-bit word comprising the bits ($\overline{B2},\overline{B1},\overline{B0}$) in order from most to least significant, while morph_id for segment 5 is a three-bit word comprising the bits ($\overline{B2},\overline{B1},B0$) in order from most to least significant. When the master code has, for example, the value 011, then morph_id for segment 0 is 011 whilst morph_id for segment 5 is 110. In this way it is ensured that the morph_id input to each local decoder is unique. It also makes changing the local IDs of the segments simple, since it is only necessary to update the 3-bit master code.

Incidentally, although it is described above that the 3 bits plus their inverses (making a total of 6 bits) are routed to each local decoder 126, it is of course possible to distribute only the three bits themselves without their inverses and to provide inverters in the appropriate local decoders to generate the inverse signal locally. However, this would have the undesirable result that the circuitry of each local decoder would not be the same.

The order of selection of the segments can be changed from cycle to cycle in a variety of ways depending on how the master 3-bit code is updated. If the master code is simply incremented every cycle (wrapping around to 000 after 111) then the segment order is rotated. This would not create the desired effect of transfer function morphing since, as indicated above, rotation does not alter the basic shape of the transfer function but simply changes the starting position along it.

To achieve morphing, the binary state of one of the three bits B0, B1, and B2 of the master code can be changed from one cycle to the next. This has the effect, when the segments are considered arranged at different respective positions in order of their IDs, of swapping various pairs of segments at certain positions in that order. For example, if the state of bit B0 is changed, then the segments at the following positions are swapped:

1<=>1
2<=>3
4<=>5
6<=>7

The distance moved by both of the segments in a pair (change in position) is 1, with four pairs being swapped at once, so the total effective move is 8. This total effective move can be used to define a segment change parameter (SCP) associated with each change in order. It is calculated by summing over all n segments the changes in ordinal positions, if any, of the segments brought about by the change in order. It serves as a measure of the overall change in ordinal position brought about by the change in order.

If the state of bit B1 is changed, then the segments at the following positions are swapped:

0<=>2
1<=>3
4<=>6
5<=>7

In this case, the distance moved by both of the segments in a pair is 2, with four pairs being swapped at once, so the total effective move (SCP) is 16.

If the state of bit B2 is changed, then the segments at the following positions are swapped:

0<=>4
1<=>5
2<=>6
3<=>7

In this case, the distance moved by both of the segments in a pair is 4, with four pairs being swapped at once, so the total effective move (SCP) is 32.

If one of these three updates is chosen at random each time, then the average total effective move per conversion cycle (average SCP per cycle) is (change*probability)=8*($\frac{1}{3}$)+16*($\frac{1}{3}$)+32*($\frac{1}{3}$)=56/3=18.67.

The total effective move (segment change parameter) is reflected in the overall change to the transfer function for each change. As mentioned above, it is desirable that the transfer function is morphed slowly from one state to another and does not make too many large changes at once. This can be achieved by limiting the average changes in ordinal position of the segments, brought about by the changes in order, in number and/or magnitude relative to the total number n of segments. This is equivalent to limiting the SCP value relative to n. Also, the difference between the maximum and minimum SCP values is preferably limited relative to n. For example, in this case the maximum and minimum SCP values are 8 and 32, so that the difference (24) is 3n. Exemplary values are given in the examples that follow.

In view of the fact that in the present example a change to bit B2 causes a comparatively large overall change of 32 (4n), it is preferable that B2 is changed least often.

One way to achieve this is to update the master code each time according to the Gray-scale code, i.e. in the following manner: 000->001->011->010->110->111->101->100->101->111 etc. In this case, B2 is changed twice over 16 cycles, whilst B1 is changed four times and B0 is changed eight times, so that the average move per conversion cycle is now (change*probability)=32*($\frac{2}{16}$)+16*($\frac{4}{16}$)+8*($\frac{8}{16}$)=192/16=12 (i.e. the average SCP is limited to 1.5 n in this case).

However, in this case a limited set of transfer functions is repeated at regular intervals. In this case, the same sequence of transfer functions would be repeated every 16 conversion cycles, giving a repeat frequency of ($F_{CLK}/16$), where $F_{CLK}$ is the frequency of the conversion cycles, which has the effect of generating discrete sidebands at this spacing.

In the above-mentioned method in which the binary state of a random one of the bits B0, B1, and B2 is changed per cycle, a change to bit B2 causes four pairs of segments to move a distance of four segments all at once. To limit the total effective move (SCP) to a total of 8 segments it is possible to split this B2 change into four separate changes, with only one change being made at any one time, i.e. (0<=>4), (1<=>5), (2<=>6), or (3<=>7). In the same way, the B1 change may be limited to an total effective move (SCP) of 8 segments by splitting it into two possible changes, for example (0<=>2 & 4<=>6) or (1<=>3 & 5<=>7). The B0 change already causes an total effective move of eight, so there is only one possible choice: (0<=>1 & 2<=>3 & 4<=>5 & 6<=>7).

These seven possible changes are labelled for convenience as follows:

B0: (1<=>1 & 2<=>3 & 4<=>5 & 6<=>7)
B1a: (0<=>2 & 4<=>6)
B1b: (1<=>3 & 5<=>7)
B2a: (0<=>4)
B2b: (1<=>5)
B2c: (2<=>6)
B2d: (3<=>7)

This can be implemented by maintaining and updating a seven-bit master code (rather than a three-bit master code as before), with each of the above seven possible changes being achieved by swapping the bit value of a corresponding one of the seven bits. In order to achieve this, the local IDs correspond to this seven-bit master code as shown in the table of FIG. 15. Comparing this table to that in FIG. 13, it can be seen that the B2 column of FIG. 13 has been split into four columns B2a, B2b, B2c and B2d, corresponding respectively to the four changes labelled B2a, B2b, B2c and B2d mentioned above, with each column containing only one pair of opposite binary values at the two positions of the pair of segments required to be swapped when those binary values are reversed. Similarly, the B1 column has been split into two columns B1a and B1b, corresponding respectively to the two changes labelled B1a and B1b mentioned above, with each column containing only two pairs of opposite binary values at the four positions of the two pairs of segments required to be swapped when those binary values are reversed. The B0 column of FIG. 15 is the same as that of FIG. 13.

The morphing control signal M now has a total of 14 bits (the seven bits B0, B1a, B1b, B2a, B2b, B2c, B2d and their inverses) to be distributed to the local decoders 126. Since each local decoder requires only a three-bit morph_id, it picks off three of the bits from the morphing signal M according to the table shown in FIG. 16.

In this example, the morphing control section 24 is responsible for swapping one of the seven bits of the morphing signal M at random each cycle, and the average move per conversion cycle (average SCP) is now 8 (n), compared to the average of 18.67 without the splitting of the higher-order bits B1 and B2.

This random selection of one of seven possible choices is preferably implemented by generating a random 3-bit number which selects one of the seven changes to make. Since this random 3-bit number actually has eight states, two of them are preferably made to select the change represented by swapping bit B0.

As mentioned above, in the transfer function morphing section 122 described above with reference to FIG. 12, the decoding of the binary input word D1-Dm into thermometer-coded signals T1-Tn is not done "globally" (by a centralised binary-to-thermometer decoder such as the decoder 6 in FIG. 1) but instead is performed locally within each of the n segments. It will be appreciated that it is also possible to implement the transfer function morphing section 22 of FIG. 8 in other different ways, for example by first generating a set of thermometer-coded signals using a binary-to-thermometer decoder such as the decoder 6 in FIG. 1, and then re-ordering these thermometer-coded signals (using, for example, a barrel shifter), to produce the segment control signals T1-Tn.

To achieve the lowest device-to-device variation, the order of selection of the segments in a DAC should ideally be changed gradually through every possible order so that as many different forms of transfer functions are traversed over the course of time. In practice, however, the overall complexity of the circuitry (for example, in terms of the gate count) required to achieve this for a large number of segments can be prohibitive. In view of this, a sensible compromise must be made between increased complexity of the circuitry on the one hand and restricting the total number of segment orders that can be covered (and therefore the amount by which device-to-device variation can be reduce by morphing) on the other hand.

Figure 17:
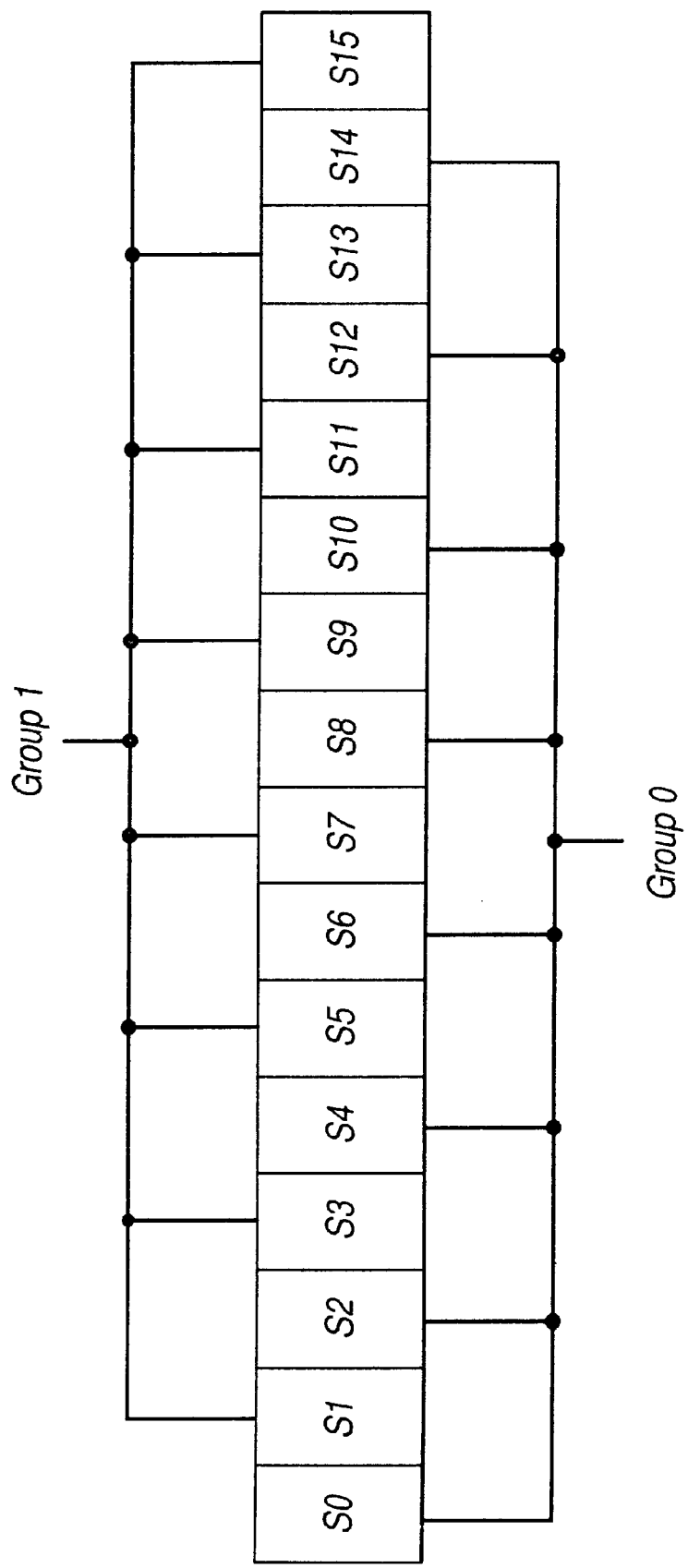
FIG. 17 is a block diagram illustrating the division of segments into separate groups of segments.

One possible compromise is to divide the segments into a number of groups, and to swap the segments only within an individual group. By further arranging for the segments within each group to be spread evenly across the entire transfer function, it is possible still to achieve good morphing performance whilst reducing the overall circuit complexity considerably. For example, FIG. 17 shows an example in which a total of 16 segment S0 to S15 are divided into two groups "Group 0" and "Group 1" comprising 8 segments each: (S0, S2, S4, S6, S8, S10, S12, S14 ) in Group 0 and (S1, S3, S5, S7, S9, S11, S13, S15 ) in Group 1. The illustrated positions of these segments are in relation to the transfer function (order of selection) and not necessarily their physical positions on the chip. Therefore it is possible (and preferable) to arrange for all the segments in one group to be situated close to each other on the chip, even though they are actually spread across the transfer function. Segments in one group are never swapped with the segments in another group.

The choice of the number of groups is another compromise. Larger groups give more linearity improvement (matching between different DACs), but smaller groups give less wideband noise because fewer segments change position location every clock cycle.

In the examples described above with reference to FIGS. 12 to 16, there were a total of 8 segments addressed by a 3-bit binary data input word D1-Dm. The local decoder in each segment had a 3-bit local ID which was compared to the 3-bit binary data input word D1-Dm to derive the thermometer-coded signals T1-Tn. In addition, the local IDs associated with each segment were made to swap around in various ways so that the segment order was continually changing. The arrangements of FIGS. 12 to 16 can easily be modified to a more practical DAC in which there are 128 segments, as will now be described.

The 128 segments can be divided into 16 groups of 8 segments, as follows:

group 0=segments (0, 16 . . . 96, 112)
group 1=segments (1, 17 . . . 97, 113) . . .
group 14=segments (14, 30 . . . 110, 126)
group 15=segments (15, 31 . . . 111, 127)

With this arrangement, each member of a group is separated by a distance of 16 segments in the transfer function from its neighbouring member of the group, and the members of each group are spread evenly across the transfer function. Each group has 4 ID bits to all members of the group common (the four least significant bits) which are fixed and different for each group, and 3 ID bits (the three most significant bits) which are different for each member of the group.

Since there are 128 segments in the DAC to be addressed, a seven-bit data word input D1-Dm is required, and the local decoder of each segment has a seven-bit local ID. The four least significant bits of this seven-bit local ID for members of a particular group can be hard-wired to a 4-bit combination unique to that group, whilst each member in the group can select three different bits from a 14-bit morphing signal bus as described above to provide the three most significant bits of the local ID for that member. Changing the master code will now swap members around within a group, but will not swap members belonging to different respective groups.

In order to reduce the total number of swaps performed (or SCP) per conversion cycle, it is also preferable that only one group is swapped for each cycle. This can be achieved by generating a four-bit random number which selects one of the groups to be active in a particular conversion cycle. The morphing control signal M then acts to swap members of the active group in that cycle.

Figure 18:
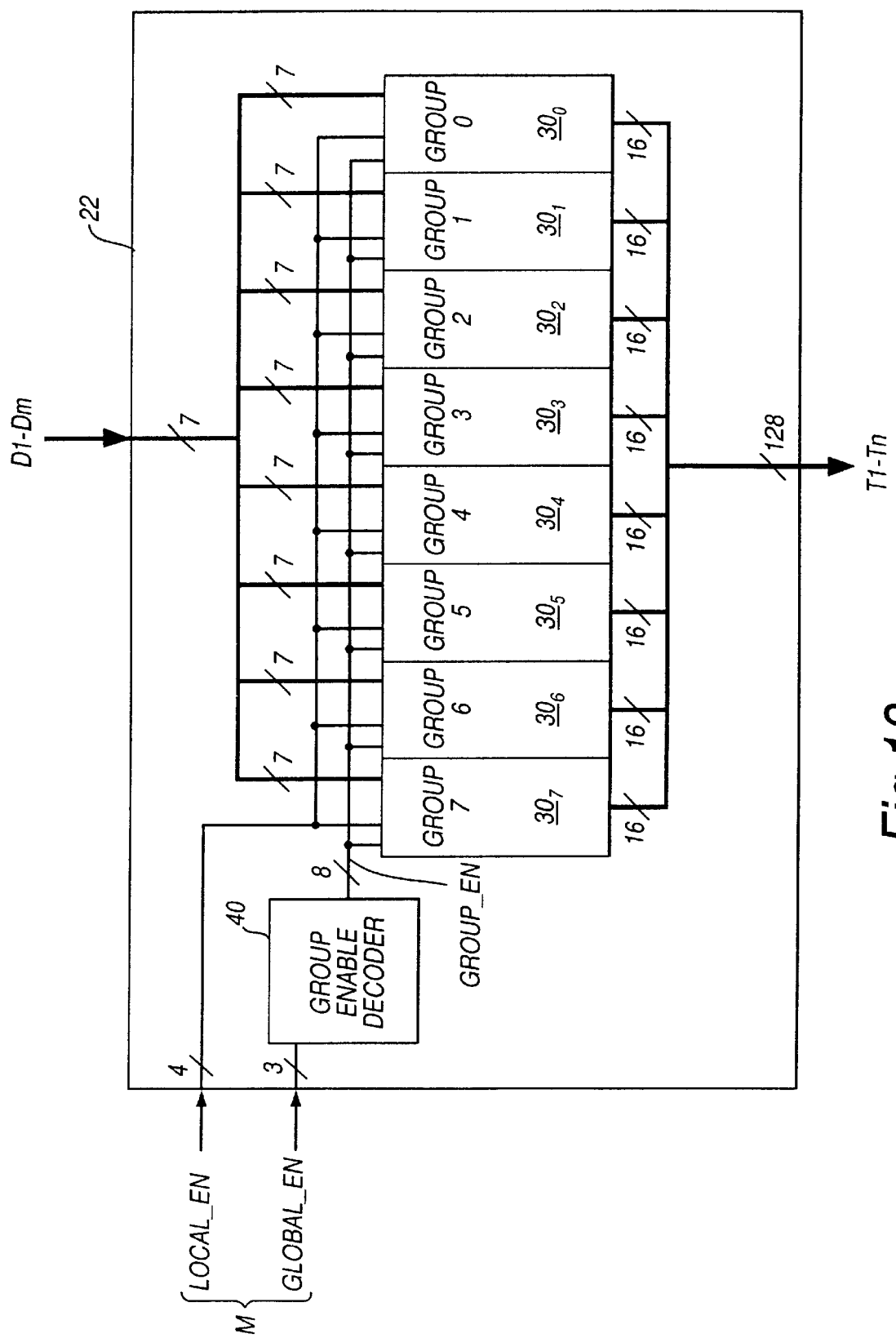
FIG. 18 is a block diagram showing an example of a transfer function morphing section in another embodiment of the present invention.

FIG. 18 shows the constitution of the transfer function morphing section 22 of FIG. 8 in another preferred embodiment of the present invention in which there are a total of 128 segments divided into 8 groups of 16 segments each, as follows:

group 0=segments (0, 8 . . . 112, 120)
group 1=segments (1, 9 . . . 113, 121)
group 6=segments (6, 14 . . . 118, 126)
group 7=segments (7, 15 . . . 119, 127)

With this arrangement, each member of a group is separated by a distance of 8 segments in the transfer function from its neighbouring member of the group, and the members of each group are spread evenly across the transfer function.

The transfer function morphing section 22 of FIG. 18 comprises a group enable decoder 8, and eight segment groups $30_0$ to $30_7$. The transfer function morphing section 22 has inputs for receiving the seven-bit binary input word D1-Dm, a four-bit "local_en" signal and a three-bit "global_en" signal. The "local_en" signal and a three-bit "global_en" signal together comprise the morphing control signal M described above with reference to FIG. 8. Each segment group 30 outputs 16 of the 128 thermometer-coded outputs T1-Tn. The group enable decoder 8 has an input for receiving the global_en signal and an output for outputting an 8-bit group_en signal. Each segment group 30 has an input for receiving a predetermined one of the bits of the 8-bit group_en signal, an input for receiving the local_en signal, and an input for receiving the binary input data word D1-Dm.

The local_en signal and the global_en signals are generated every conversion cycle by the morphing control section 24 shown in FIG. 8. The global_en signal is a 3 bit random number which selects one of the eight segment groups $30_0$ to $30_7$ to have its segment members swapped for that particular conversion cycle. The segments in all non-selected segment groups retain their segment ordering from the previous cycle. The group enable decoder 40 decodes this three-bit global_en signal to produce a 1-of-N eight-bit group_en signal, with a different one of the group_en bits being set to 1 for each different value of the three-bit global_en signal (all the remaining group_en bits are set to 0). The eight bits of group_en signal are applied to different respective ones of the eight segment groups $30_0$ to $30_7$.

The local_en signal generated by the morphing control section 24 is a four-bit random number which selects one of 15 possible segment swaps to perform on segments in the segment group 30 selected in that conversion cycle. Since the local_en signal has 16 different states, two of them select the same one of the 15 possible segment swaps. This will be described in more detail below.

Figure 19:
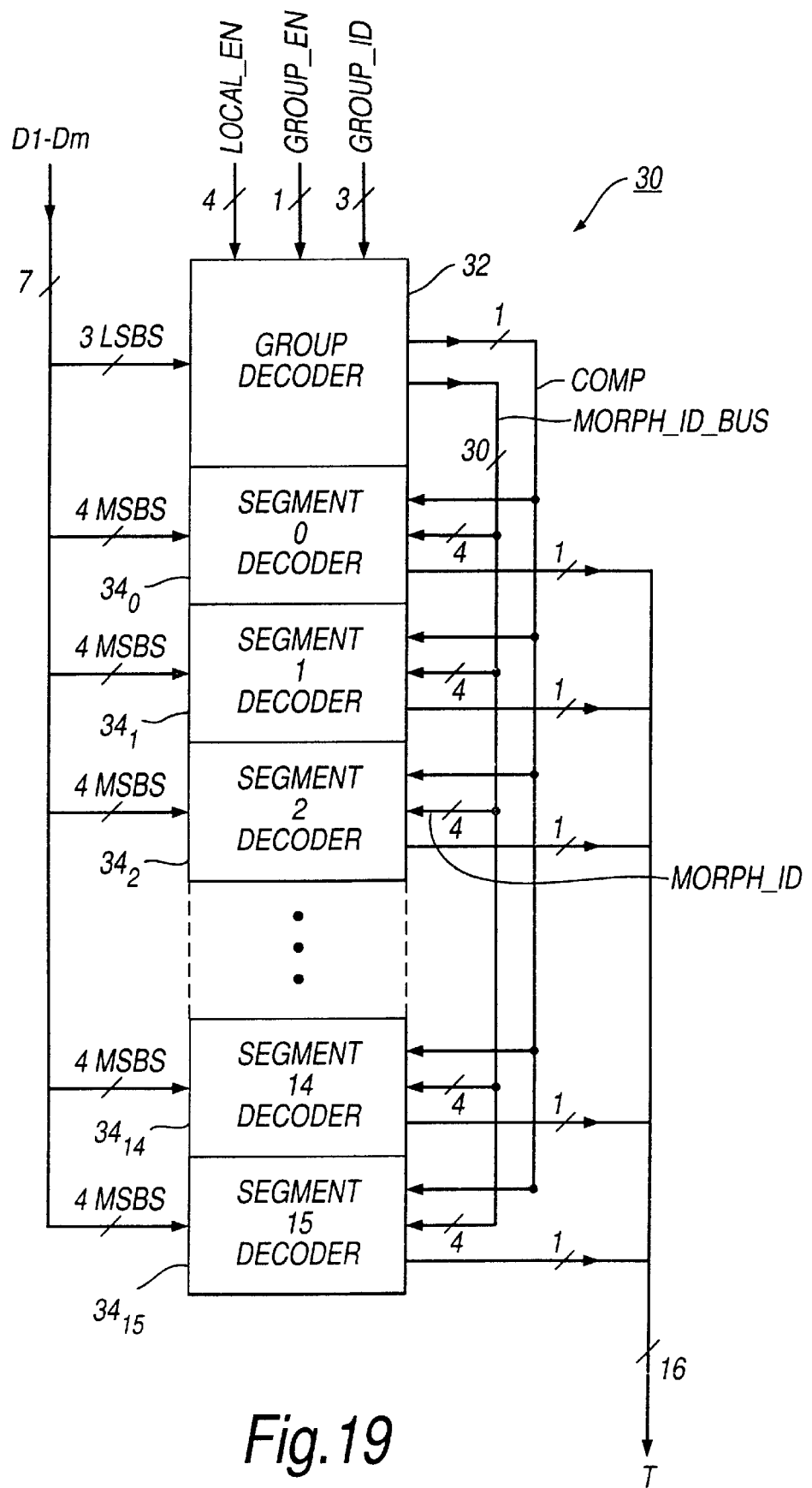
FIG. 19 is a block diagram showing the constitution of one segment group shown in FIG. 18.

FIG. 19 shows the constitution of the segment groups $30_0$ to $30_7$ in more detail. Each segment group 30 comprises 16 segment decoders $34_0$ to $34_{15}$ and a single group decoder 32 shared in common between all of the segment decoders $34_0$ to $34_{15}$. The group decoder 32 has inputs for receiving the local_en and group_en signals described above, and an input for receiving the three least significant bits of the binary input data word D1-Dm. The group decoder 32 also has an input for receiving a three-bit group_id signal which represents the three least significant bits of the local ID of all of the 16 segments in the group. The group decoder 32 also has a single-bit "comp" output and a 30-bit morph_id_bus output. Each segment decoder 34 has an input for receiving the four most significant bits of the binary input data word D1-Dm, further inputs for receiving the comp signal and selected bits of the morph_id_bus signal output from the group decoder 32, and a single-bit output at which one of the thermometer-coded output signals T is output.

Figure 20:
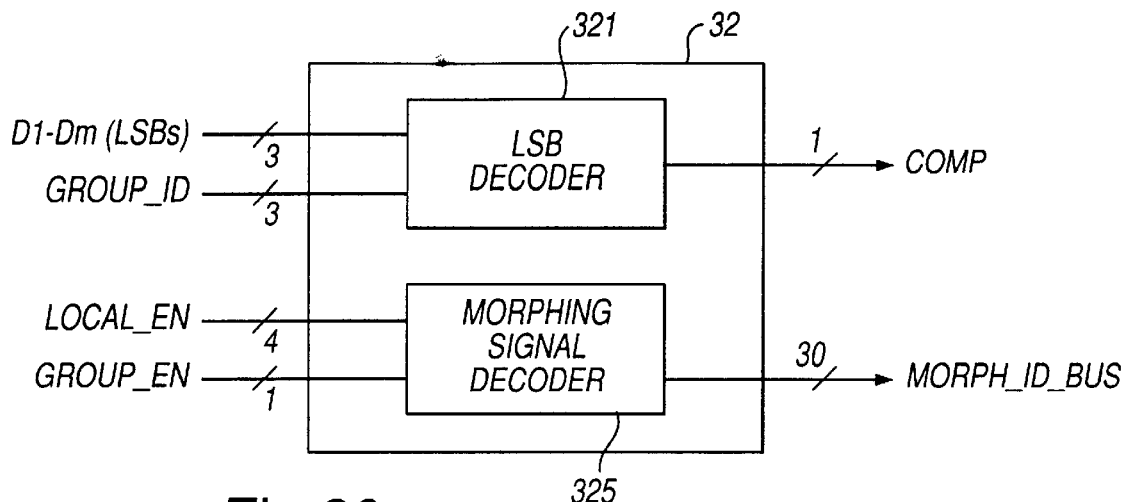
FIG. 20 is a block diagram showing the constitution of a group decoder shown in FIG. 19.
Figure 21A:
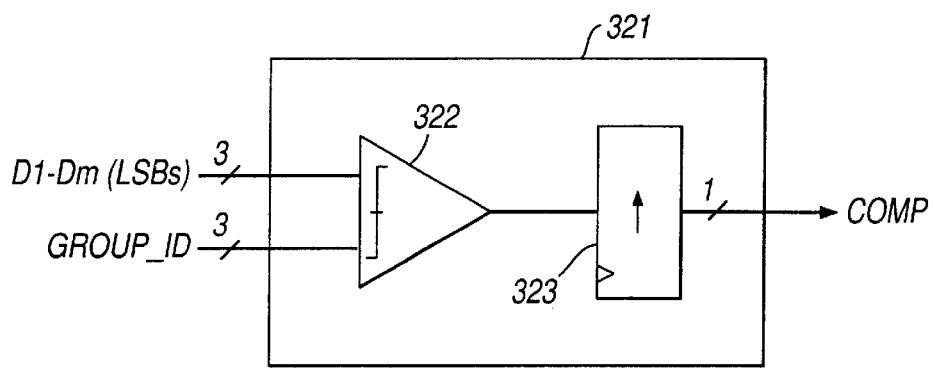
FIGS. 21(A) and 21(B) are block diagrams showing in more detail the constitution of the group decoder of FIG. 19.

The constitution and operation of the group decoder 32 and the segment decoders 34 will now be described in more detail with reference to FIGS. 20 to 22. The group decoder 32 comprises an LSB decoder 321, shown in more detail in FIG. 21(A), and a morphing signal decoder 325, shown in more detail in FIG. 21(B). The LSB decoder 321 comprises a comparator 322 and a latch 323, whilst the morphing signal decoder 325 comprises a swap selector 326 and a set of D-type flip-flops 327. Each segment decoder 34 comprises a comparator 342 and a latch 344.

The comparator 322 in the LSB decoder 321 compares the three least significant bits of the binary input word D1-Dm with the unique three-bit group ID "group_id" for that group. The result of this comparison is latched by latch 323 and output as signal "comp" and passed to the comparator 342 in each of the segment decoders $34_0$ to $34_{15}$. The comparator 342 in the segment decoder 34 then performs a similar operation on the most significant bits, comparing the four most significant bits of the binary input word D1-Dm with the four-bit "morph_id" for that segment, making use of the result "comp" of the comparison of the least significant bits. The result of the comparison performed in a segment decoder 34 represents the thermometer-coded output signal T which controls the differential switch 4 for that segment.

In the example described above with reference to FIG. 12, in which the segments were not divided up into groups, the comparator 126 in each of the local decoders 124 compared all m bits of the binary input word D1-Dm with all m bits of the morph_id signal. In this example, the operations performed by the local decoder are split into operations on the least significant bits, performed by the LSB decoder 321 in the group decoder 32, and operations on the most significant bits, performed by the segment decoder 34. The LSB decoder 321 makes use only of the three least significant bits of the binary input word D1-Dm, and the three least significant bits (group_id) of the segment ID. The segment decoder 34 makes use of the four most significant bits of the binary input word D1-Dm, and the four most significant bits (morph_id) of the segment ID. A carry bit "comp" is required to be communicated from the least significant bit comparator 322 to the most significant bit comparator 342.

It will be appreciated that this two-stage comparison process is not essential. It could be arranged that a single seven-bit comparison is performed for each segment, with the four most significant bits being comprised of the morph_id bits and the three least significant bits being comprised of the group_id bits in common to all the segments in a group. However, it is preferable that a two-stage process is used since the circuitry for the comparison of the three least significant bits can be shared between all segments in a group, requiring only a four-bit comparator to be provided in each of the segment decoders. In addition, a two-stage process allows the operations performed by the local decoder to be pipelined, with operations from one conversion cycle overlapping with operations from an adjacent cycle, as is discussed in detail in the assignee's European patent publication no. EP-A-1100203 (corresponding to the assignee's co-pending U.S. patent application Ser. No. 09/708677).

The process of generating the four most significant bits of each segment's ID (or morph_id) will now be described with reference to FIGS. 21(B), 23 and 24. As mentioned above, the local_en signal received by the morphing signal decoder 325 from the morphing control section 24 is a four-bit random number which selects one of 15 possible segment swaps to perform on segments in the segment group 30 selected in that conversion cycle by the random group selection signal group_en. For the example described above with reference to FIG. 12 in which there were only 8 segments in a group, one of seven possible swaps was chosen at random by a three-bit random number and achieved by swapping the binary state of one of the bits of a seven-bit master code. A function equivalent to this is performed by the morphing signal decoder 325 in the present example.

In this case, there are 16 segments in a group requiring a four-bit morph_id. If the swapping is effected by way of changing the binary state of one of bits B3, B2, B1 and B0 of a four-bit master code, then the following swaps would occur:

B0: (02468ACE)<=>(13579BDF)
B1: (014589CD)<=>(2367ABEF)
B2: (012389AB)<=>(89ABCDEF)
B3: (01234567)<=>(89ABCDEF)

Here, the members of each group are denoted in hexadecimal notation as members 0, 1, 2, . . . , 9, A, B, C, D, E, F. For example, in group 0 member 0 is segment 0, member 1 is segment 8, member E is segment 112 and member F is segment 120.

The total distance moved by the members within a group for each of the above swaps is 16, 32, 64 and 128 for swaps B0, B1, B2 and B3 respectively. Since each member of a group is actually separated by 8 segments from a neighbouring member, this represents an average total effective move (SCP) of 128 (n), 256 (2n), 512 (4n) and 1024 (8n) segments respectively. In order to limit the total change caused to the transfer function, the above changes are split into the following sub-choices in a similar way as described above:

B0: (02468ACE)<=>(13579BDF)
B1a: (048C)<=>(26AE)

B1*b:* (159D)<=>(37BF)
B2*a:* (08)<=>(4C)
B2*b:* (19)<=>(5D)
B2*c:* (2A)<=>(6E)
B2*d:* (3B)<=>(7F)
B3*a:* (0)<=>(8)
B3*b:* (1)<=>(9)
B3*c:* (2)<=>(A)
B3*d:* (3)<=>(B)
B3*e:* (4)<=>(C)
B3*f:* (5)<=>(D)
B3*g:* (6)<=>(E)
B3*h:* (7)<=>(F)

The total change for each of these choices is a move of 16 members. As each member is separated by 8 segments, the total effective move (SCP) for any change is 16×8 segments, i.e. 128 segments. Thus, in this case the average SCP per cycle is limited to n.

Figure 21B:
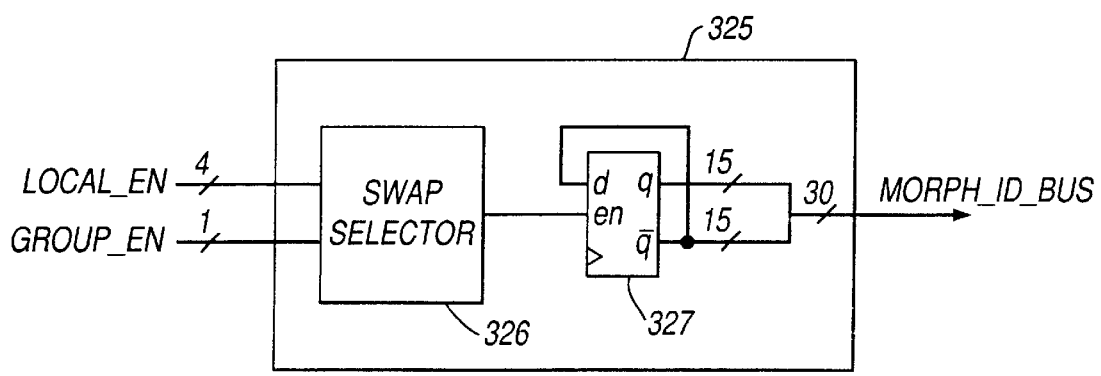
Figure 22:
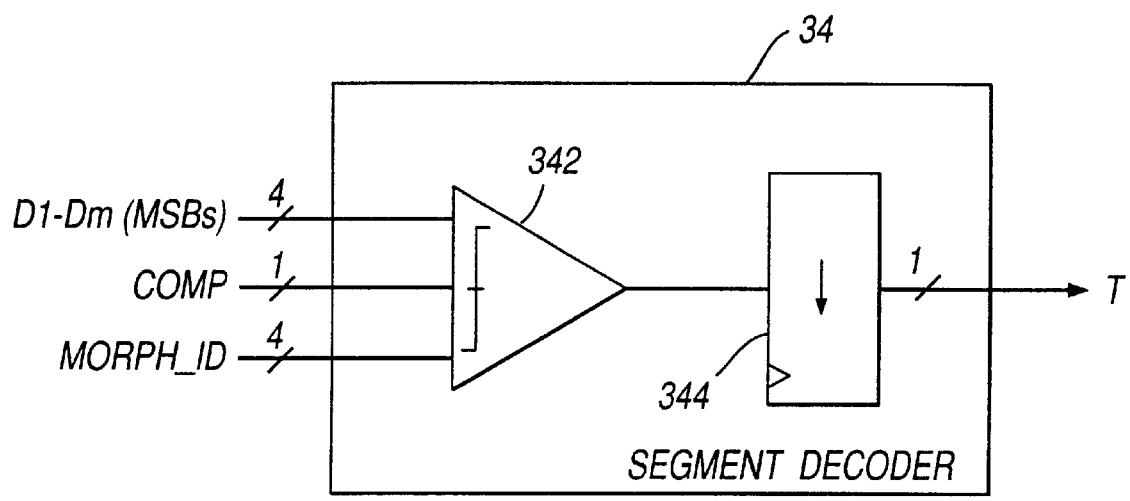
FIG. 22 is a block diagram showing the constitution of a segment decoder shown in FIG. 19.

The master code described above which is updated every conversion cycle is represented in this example by the 15 Q outputs of the set of 15 D-type flip-flops 327 in FIG. 21(B). The 15 $\overline{Q}$ outputs together with the 15 Q outputs form the 30-bit morph_id_bus signal which is fed to the segment decoders 34. Each segment decoder uses an unique set of four bits from the morph_id_bus signal to form its own four-bit morph_id signal as summarised in the table of FIG. 23.

The four-bit local_en signal selects one of the above 15 swaps to make in a particular conversion cycle. The swap is only made if the group_en signal is high for that particular group in that cycle. Since the local_en signal has 16 different states, two of them select the same one of the 15 possible segment swaps. The swap selector 326 in the morphing signal decoder 325 generates a 1-of-N 15-bit intermediate decode signal according to the table shown in FIG. 24, with the high bit selecting one of the bits to swap. In this example, the swap "B0" is activated for local_en values of both 0000 and 0001. No swap is performed when group_en is set to 0.

The $\overline{Q}$ outputs of the set of D-type flip-flops 327 are fed back as respective D inputs to the flip-flops. This causes the outputs to toggle each time the flip-flop is clocked. However, since only one flip-flop is enabled by the intermediate decode signals, only one bit of the 15-bit master code is toggled each conversion cycle.

With 16 groups of 8 possible swaps each (or equivalently 8 groups of 16 possible swaps), it takes an interval of (on average) 128 clock cycles for a given swap to be repeated. This has the effect of turning each distortion component into noise spread over a band of about ±($F_{CLK}$/128), so that each noise band is about 10 MHz wide (or ±5 MHz) at 624 Ms/s. By choosing $F_{CLK}$ and the average swap repetition interval appropriately, the noise bands centred on each distortion component can be confined in size so that they do not extend into the wanted signal band.

In one embodiment the noise spreading is actually half this, so that each noise band is about 5 MHz wide (or ±2.5 MHz) at 624 Ms/s. This is achieved because the DAC is provided with two blocks of decoder circuitry, one being an "odd" block used to decode the input signal in odd-numbered conversion cycles and the other being an "even" block used to decode the input signal in even-numbered conversion cycles. Thus, each "odd" and "even" block is clocked at half the DAC update rate, as described in more detail in the assignee's U.S. Pat. No. 6,218,974.

As mentioned above in relation to the use of a Gray-code updating method, if the same set of transfer functions is repeated every 16 cycles, this has the effect of generating discrete sidebands at a spacing of ($F_{CLK}$/16). However, if the set of transfer functions changes as well, then the noise is spread over approximately this bandwidth. If the noise bandwidth spread is too large then the rate at which segments are swapped can be reduced so that the morphing happens more slowly. The segment order does not have to be changed every cycle, so that in some cycles (e.g. alternate cycles) it can be arranged that there is no change in segment order.

The choice of using 8 groups of 16 segments instead of 16 groups of 8 segments is partly driven by layout considerations. Each group is laid out as a row of 16 members, with the group logic at one end. Since the whole block is duplicated for "odd" and "even" logic, this layout amounts to a 16×16 array, with the common logic between the two groups. Each member (local decoder, about 200 gates) is approximately square (since that is the best shape for minimising interconnect) so the top-level layout is approximately square.

The above-described morphing technique can also be used in combination with the segment rotation technique described in detail in the assignee's European patent publication no. EP-A-1100203 (corresponding to the assignee's co-pending U.S. patent application Ser. No. 09/708677), the entire content of which is incorporated herein by reference.

As illustrated schematically in FIGS. 25(A) to (C), in the rotation technique, the segments are rotated each conversion cycle by a certain number r of segments (rotation amount). For example, the segment ordering of FIG. 25(A) has been rotated by an amount r of three segments, with segments wrapping around from the end back to the beginning. A further rotation of three segments brings the segment ordering to that shown in FIG. 25(C). This has the effect of shifting the starting position in the transfer function without actually altering the shape of the transfer function.

The facility for segment rotation can easily be included in the morphing circuitry described above with reference to FIGS. 18 to 24 by adding in each conversion cycle a rotation amount r to the segment's complete local ID, made up by a combination of the group_id and morph_id associated with the segment. This can be achieved by adding the three least significant bits of the rotation amount r to the group_id value before the comparison operation is performed by the comparator 322 in the LSB decoder 325 of the group decoder 32, and adding the four most significant bits of the rotation amount r to the morph_id value before comparison by the comparator 342 in the segment decoders 34. The carry bit from the least significant bit adder would also be communicated to the most significant bit adder.

When morphing is applied in combination with rotation, the morphing removes the device-to-device variation still present after rotation and also removes the discrete tones in the spectrum caused by the rotation. This previously required the use of random spreading of the rotation amount which is no longer necessary when morphing is used, although this can still be used to improve the smoothness of the noise floor.

Taking the example of a GSM communication system, where the channels are spaced apart by 100–200 kHz, it is desirable to spread the noise by at least the width of one channel. The spreading should also be small enough that the distortion components generated by the rotation do not spread significantly away from their intended positions, which are typically at least 5 MHz away from the band of interest. The spreading caused by morphing is typically of the order of ±2.5 MHz, so that the rotation components do not spread into the band of interest.

There will now be described a third aspect of the invention relating to circuitry having a segmented architecture, and in particular to segmented digital-to-analog converters (DACs).

As mentioned above, the assignee's European patent publication no. EP-A-1100203 (corresponding to the assignee's co-pending U.S. Pat. application Ser. No. 09/708677) describes a "noise shaping" technique, whereby distortion components caused by device non-linearity are translated in frequency such that they appear outside the wanted signal band (out-of-band). This is achieved by rotating the order in which the segments are selected, and in addition applying some small random spread to the rotation amount so that discrete tones do not appear in the output. The third aspect of the present invention relates to circuitry to facilitate the selection or confirmation of appropriate parameters for achieving the desired re-positioning of the distortion, but has more general applicability to other situations as will be mentioned below.

Figure 26:
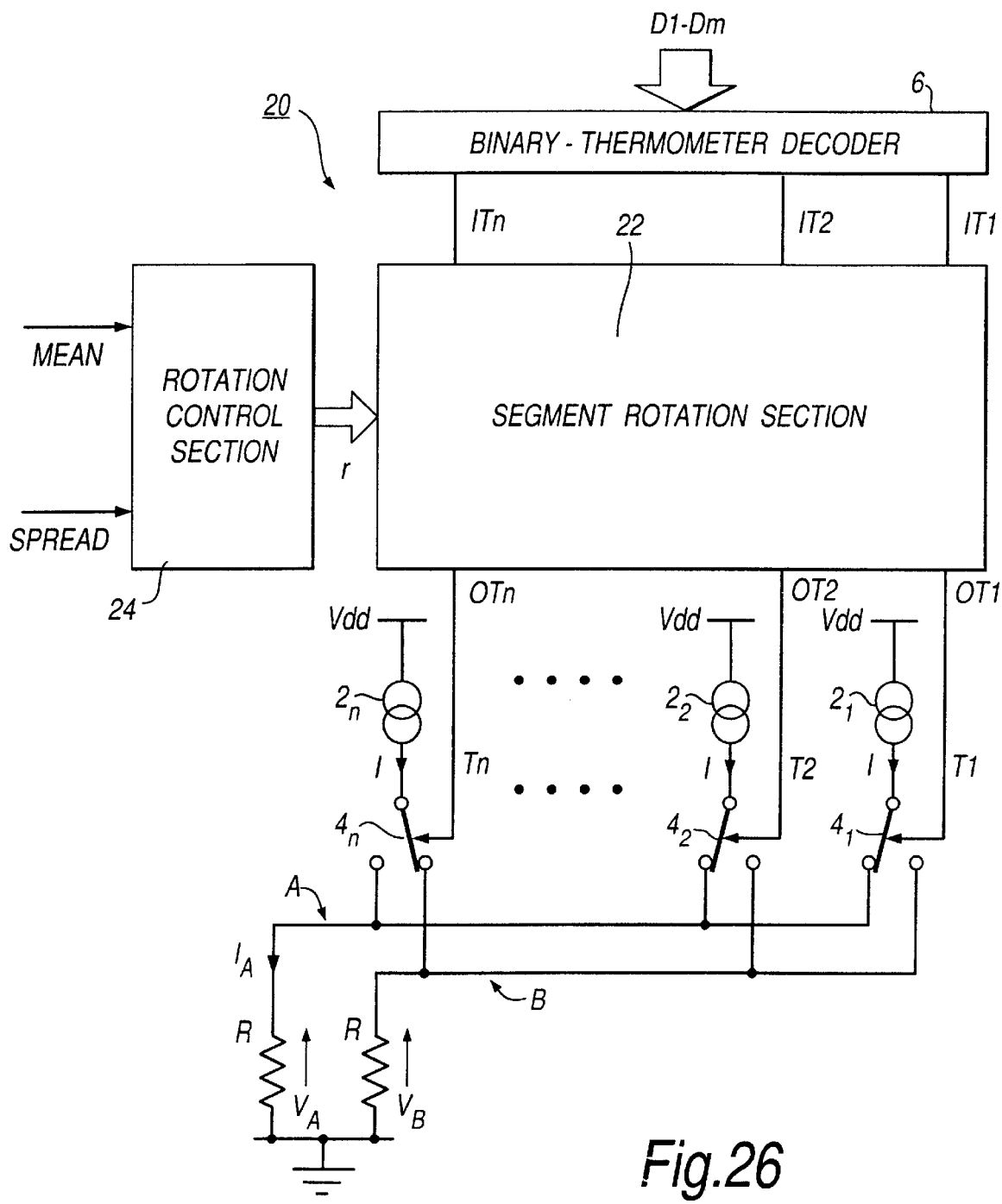
FIG. 26 is a block diagram of parts of a previously-considered DAC.

FIG. 26 shows parts of a DAC to which the third aspect of the present invention can be applied. The FIG. 26 DAC includes a digital circuitry portion and an analog circuitry portion. The analog circuitry portion includes a plurality of segments (or cells), each segment having a constant current source 2 and a switch 4. The switch 4 in each segment is controlled by an individually-corresponding thermometer-coded signal TO supplied thereto from the digital circuitry portion DC.

Figure 27:
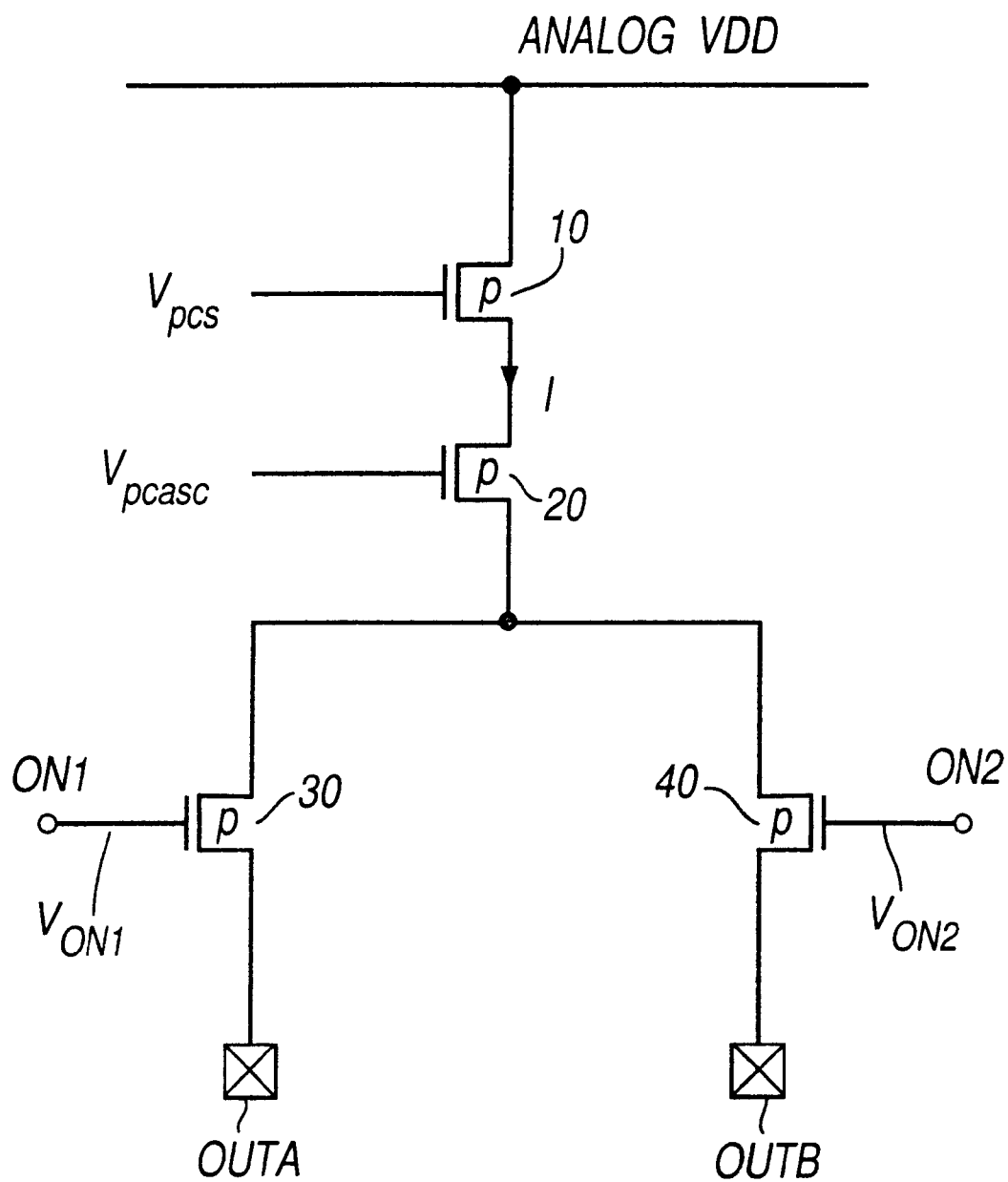
FIG. 27 shows in more detail the construction of parts of a segment in the FIG. 26 DAC.

FIG. 27 shows in more detail the construction of the current source 2 and the switch 4 in one of the segments of FIG. 26. Constant current transistor 10 has a gate which is maintained at a potential $V_{pcs}$ and serves to generate the constant current I in the segment concerned. Cascode transistor 20 has a gate which is maintained at a potential $V_{pcasc}$ and acts to shield the constant current transistor 10 from voltage variations when the circuitry is in use. These two transistors together make up an individual current source 2 of FIG. 26. First and second transistors 30 and 40 make up the segment's individual differential switching circuit 4 in FIG. 26. Circuitry suitable for driving these first and second transistors 30 and 40 is described in the assignee's United Kingdom patent publication no. GB-A-2356304 (corresponding to the assignee's co-pending U.S. patent application Ser. No. 09/634738), the entire content of which is incorporated herein by reference. The respective drains of the transistors 30 and 40 are connected to respective output nodes OUTA and OUTB which correspond respectively to the first and second terminals of the FIG. 26 differential switching circuits.

In the FIG. 26 DAC, the digital circuitry portion includes, in addition to a binary-thermometer decoder 6, a segment rotation section 22 and a rotation control section 24. The segment rotation section 22 has n inputs at which a set of thermometer-coded input signals IT1 to ITn are received. These thermometer-coded input signals IT1 to ITn are produced by the binary-thermometer decoder 6 based on a binary input word D1-Dm applied to the DAC.

The segment rotation section 22 also has n outputs at which respective ones of the thermometer-coded output signals OT1 to OTn of the digital circuitry DC are generated. The segment rotation section 22 also has a control input connected to an output of the rotation control section 24 for receiving therefrom a rotation amount r. The rotation control section 24 has first and second inputs for receiving respectively externally-applied control signals MEAN and SPREAD.

The DAC performs a series of operation cycles (conversion cycles) at a predetermined operating frequency (sampling rate) $F_{DAC}$. $F_{DAC}$ is, for example, 100 million samples per second (100 Msamples/s). In each cycle, the binary-thermometer decoder 6 converts the externally-applied input word D1-Dm into the n thermometer-coded signals IT1 to ITn. Also in each cycle, the segment rotation section 22 receives a value of the rotation amount r to be used in that cycle and derives the n thermometer-coded output signals OT1 to OTn from the thermometer-coded input signals IT1 to ITn in accordance with the received r-value.

The effect of the rotation of the segments can be explained with reference to FIGS. 28(A) to 28(C). Each plot illustrates a signal-to-noise ratio (SNR) of an output signal ($V_A$–$V_B$) of the FIG. 26 DAC over a frequency range from DC to a frequency of one half of the DAC sampling rate $F_{DAC}$. In each plot, the SNR represented on the vertical axis is measured in dB, and frequency, represented on the horizontal axis, is measured as a proportion of the sampling rate $F_{DAC}$. It is assumed in this example that the number n of segments is 64.

It will be seen that, in each example, there is a broad noise peak from approximately 0.3 $F_{DAC}$ to 0.5 $F_{DAC}$ (the Nyquist frequency). This broad noise peak is the result of high-pass-filtered dither applied to the input data D1-Dm to remove the effect of quantisation errors. For the purposes of the present explanation, this broad noise peak can be ignored.

In the present example, it is assumed that the DAC is being used to synthesise at its output an output signal made up of four "tones" T, i.e. four different frequency components. These four tones are centred around a frequency near to 0.09 $F_{DAC}$. Each tone T has a peak amplitude of –13 dB of the full-scale output amplitude FS of the DAC. The peak of the sum of the tones is –1 dB FS. Incidentally, the output signal is assumed to be made up of four tones in the present example because plural tones make it easier to identify noise components in the output spectrum.

Figure 28A:
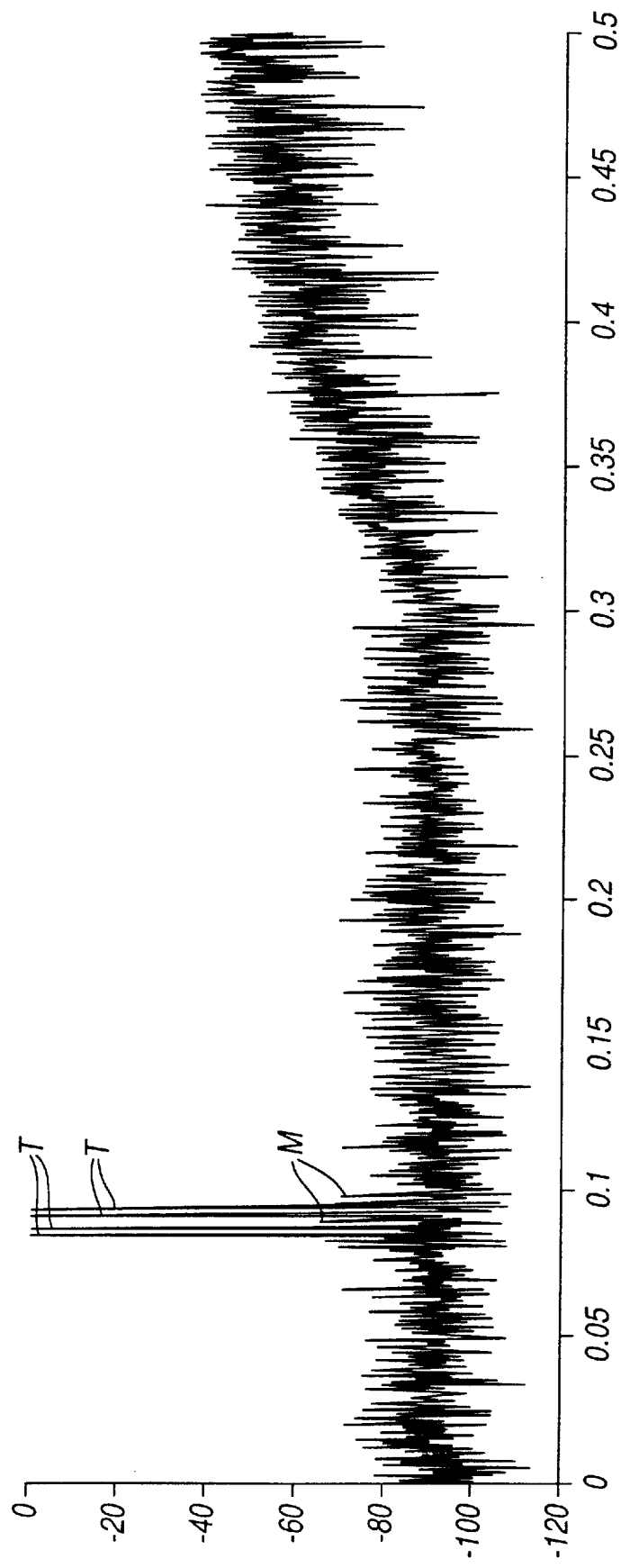
FIG. 28(A), FIG. 28(B) and FIG. 28(C) are simulated plots of an output frequency spectrum of a DAC for use in illustrating the effects of applying segment rotation.

FIG. 28(A) shows the output-signal frequency spectrum when no segment rotation is carried out from one cycle to the next, i.e. r=0 in each cycle. It can be seen that, although the average noise level in the frequency range from DC to 0.3 $F_{DAC}$ is around –90 dB, there are a number of significant intermodulation products M at frequencies close to the four tones T. These intermodulation products M are the result of the segment mismatches.

Figure 28B:
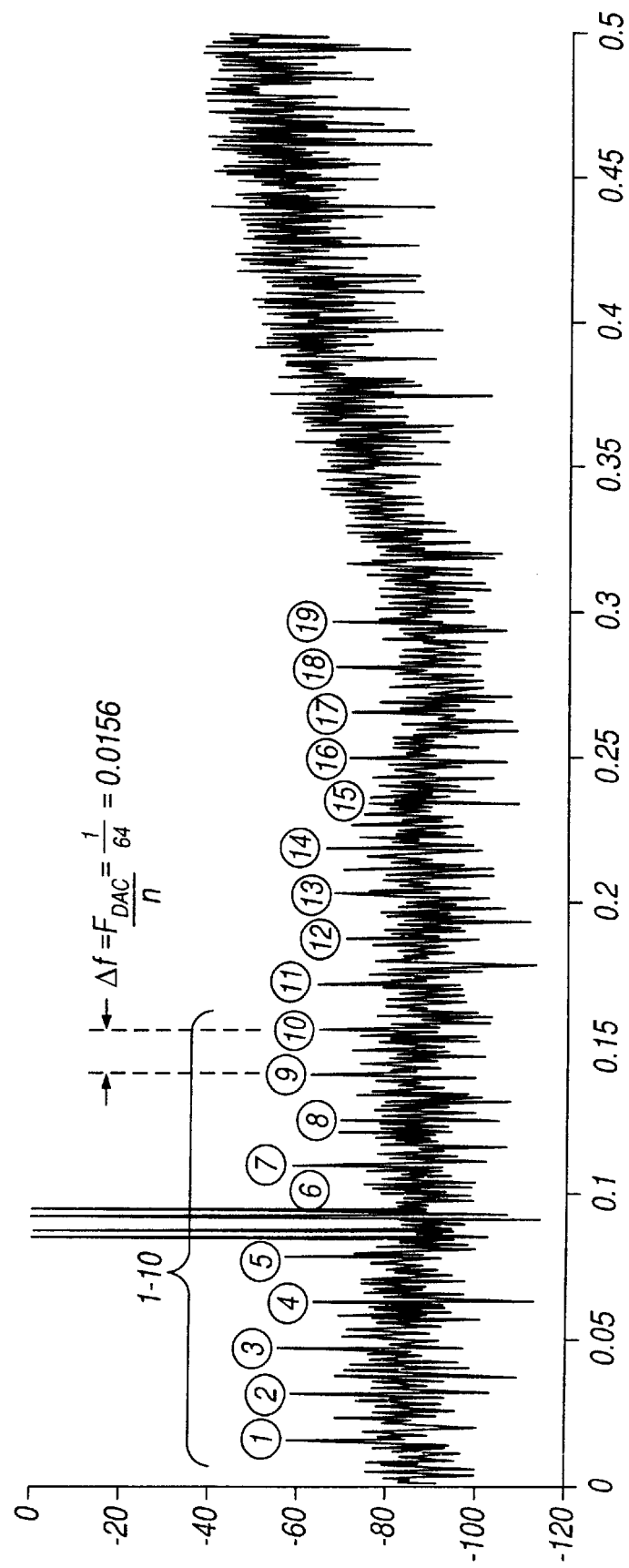

FIG. 28(B) shows the output-signal frequency spectrum when a rotation amount r=1 is used in each cycle. In this case, it can be seen that the intermodulation products M close to the tones T are now absent. Instead, however, the output-signal frequency spectrum contains frequency components labelled 1 to 19 at frequency intervals $\Delta f = F_{DAC}/n$ (=0.0156 $F_{DAC}$ in this example). These frequency components are present in the output-signal frequency spectrum as a result of the segment rotation from one cycle to the next, and are referred to hereinafter as "rotation components".

The first rotation component (component 1) has the frequency r$\Delta f$. The second rotation component (component 2) has the frequency 2 r$\Delta f$, and the third and higher-order rotation components are at frequencies 3r$\Delta f$, 4r$\Delta f$, etc.

On average, the rotation components decrease in magnitude the higher the order. However, as can be seen in FIG. 28(B), for example, components 1 and 2 are no larger than component 3, contrary to what would be expected on average. This is simply a statistical variation for the particular plot of FIG. 28(B).

When the rotation amount r=1, as in the plot of FIG. 28(B), the most significant components 1 to 10 are all contained within a band of frequencies from DC to 0.16 $F_{DAC}$. This means that all of the components are in a desired range of output-signal frequencies of the DAC. For example, in a system in which 4× over-sampling is used, the desired range of output-signal frequencies is from DC to 0.125 $F_{DAC}$.

Figure 28C:
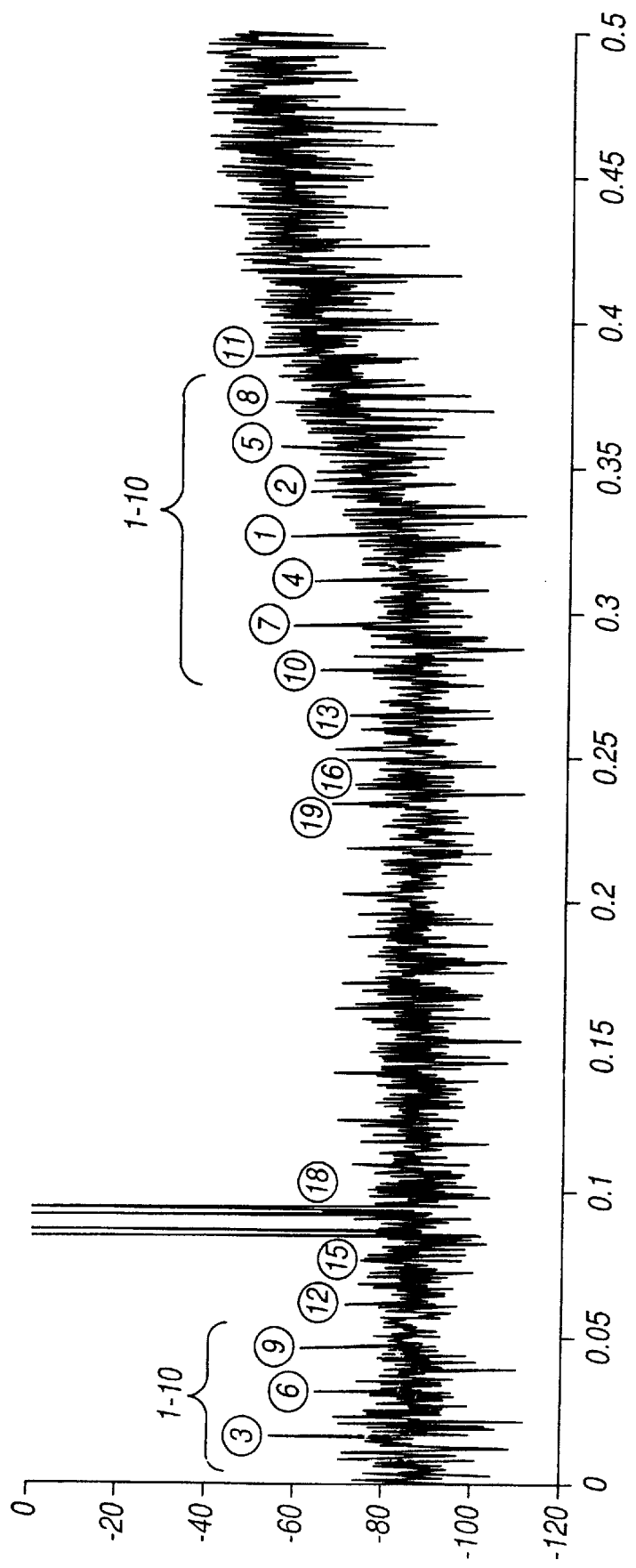

FIG. 28(C) shows the output-signal frequency spectrum when the rotation amount r=21 in each cycle. The rotation components 1 to 19 are now located very differently from in FIG. 28(B). The first rotation component (component 1) is located at a frequency of 21Δf. Component 2, which should have a frequency of 2rΔf(=42Δf), is mapped to a frequency of 22 Δf. This mapping occurs because 42 Δf is beyond the Nyquist frequency (n/2)Δf(=32 Δf) by ±10Δf, so the component maps to (n/2−10)Δf=22 Δf. Similarly, component 3 maps to Δf (because 3rΔf(=63 Δf) is +31 Δf beyond the Nyquist frequency the component maps to (n/2−31)Δf=Δf). Component 4 maps to 20 Δf(4rΔf=88 Δf is +52 Δf beyond the Nyquist frequency, so maps to −20 Δf, which being less than 0 maps in turn to +20Δf). The higher-order components are mapped in the same way.

As can be seen from FIG. 28(C), of the 10 lower-order components 1 to 10, only components 3, 6 and 9 are now contained in the desired range from DC to 0.125 $F_{DAC}$. There are additionally some higher-order components (components 12, 15 and 18) in the desired frequency range, but these are higher-order components of limited significance. Incidentally, the relatively large size (compared to the other components) of the component 18 in FIG. 28(C) is also a statistical variation. On average, the component 18 would be smaller in magnitude than is shown in FIG. 28(C).

Non-integer values of the rotation amount r can be achieved by applying a small random spread to the rotation amount by varying it from one cycle to the next, which also has the effect of smoothing the noise floor. The noise-shaping characteristics of the device are set using the above-mentioned externally-applied control signals MEAN and SPREAD to the rotation control section 24 of FIG. 26.

Although by an appropriate selection of the rotation control parameters MEAN and SPREAD, the rotation components can be moved to suitable "out-of-band" positions, it is necessary to be able to make this selection for a particular application of the DAC. Some graphical techniques for systematically selecting the rotation amount r are described in the assignee's European patent publication no. EP-A-1100203 (corresponding to the assignee's co-pending U.S. patent application Ser. No. 09/708677) but even with such techniques it is desirable to be able to confirm that the rotation control parameters arrived at by such techniques are effective in moving the rotation components to the predicted frequencies. Also, when rotation is employed without also employing morphing, there will be device-to-device variation which may mean that, as between two possible alternative choices of rotation control parameters suggested by the graphical techniques, one choice will be better than the other. It is also desirable to make selection of the rotation control parameters possible without using such graphical techniques, for example when the graphical techniques are complicated by the use of morphing (as in the first aspect of the present invention) in combination with rotation.

It might be considered that actual measurements could be carried out on a DAC by the manufacturer at a test stage, or by a user of the DAC after sale, in which a suitable input signal (i.e. typical for the intended application) is applied to the DAC and actual noise components in the output signal spectrum are measured. By varying the rotation control parameters MEAN and SPREAD the rotation components could be moved to appropriate out-of-band positions in the frequency spectrum. Alternatively, rotation control parameters arrived at by the graphical techniques could be checked to confirm that resulted in the predicted out-of-band positions for the rotation components. Such measurements could advantageously be used to produce plots similar to those shown in FIGS. 28(A) to 28(C), but in practice plots as clear and easy to interpret as FIGS. 28(A) to 28(C) cannot be produced by such measurements. The FIGS. 28(A) to 28(C) plots were in fact not produced by measurement but by computer simulation based on a model DAC in which the current sources 2 of FIG. 26 (transistors 10 and 20 in FIG. 27) in the different segments are assumed to have mismatches with a standard deviation σ of 1.7%. This figure for the standard deviation σ is an artificially high one chosen to emphasise noise components in the output signal spectrum so as to make them large enough to distinguish from background noise.

A standard deviation σ of 0.06 to 0.17% has in practice been achieved in previous DACs. Such a low value for the standard deviation a makes it difficult and time-consuming in practice for the end-user to distinguish noise components from background noise and therefore difficult to select appropriate values for MEAN and SPREAD to achieve an individually-desired noise profile based on actual measurements carried out on the DAC itself.

Figure 29:
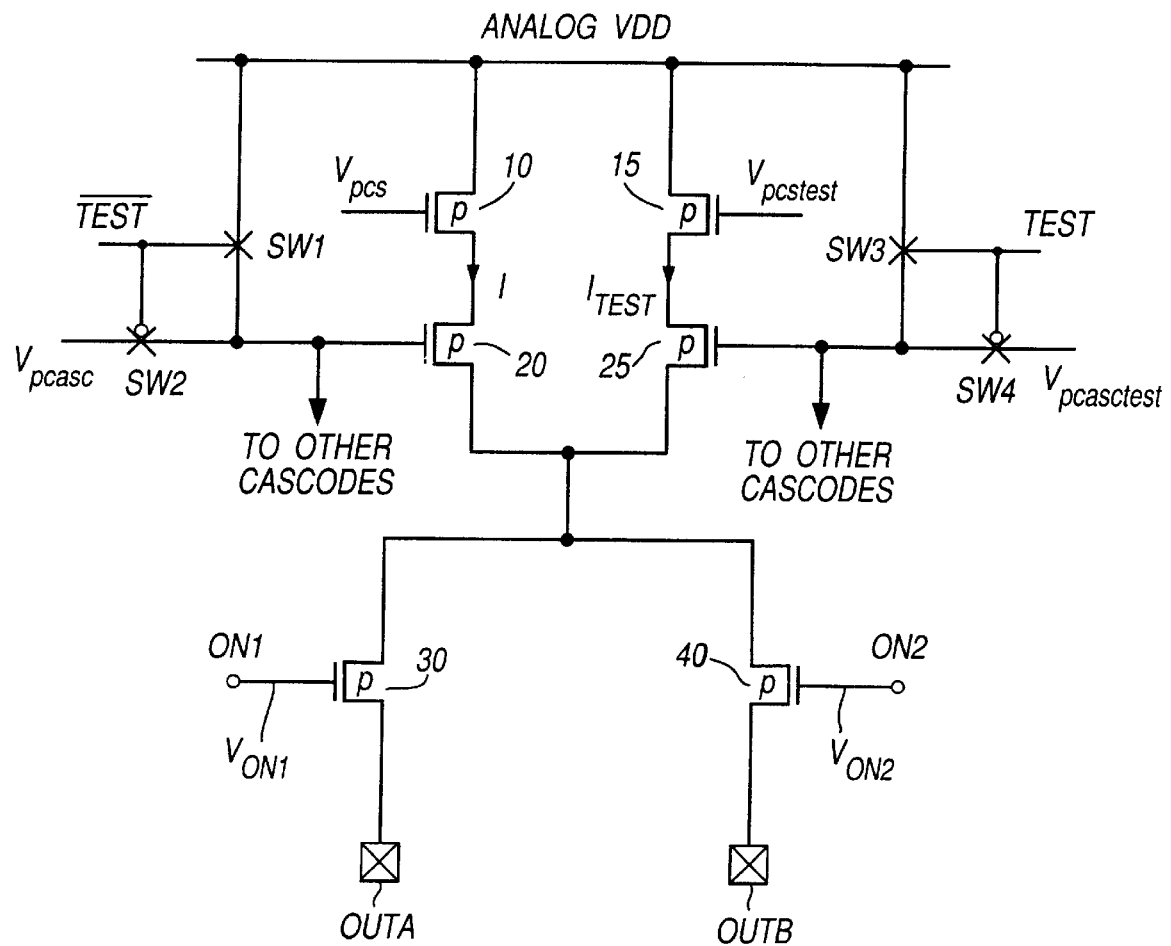
FIG. 29 shows in more detail the construction of parts of a segment of FIG. 26 in a DAC embodying the third aspect of the present invention.

As shown in FIG. 29, an embodiment of the third aspect of present invention uses two separate current sources in each segment: a test current source which is used during testing and setting up of the chip, and a main current source to be used during actual operation of the chip. The main current source comprises two PMOS FET transistors 10 and 20 as described above with reference to FIG. 27. The test current source also comprises two PMOS FET transistors 15 and 25, which differ in size from their respective corresponding main transistors 10 and 20, as will be explained below.

Only one of these two current sources is enabled at any one time, so that when the main current source is selected a highly-matched operating current I is generated and fed to the differential switch formed by transistors 30 and 40, and when the test current source is selected a poorly-matched test current $I_{test}$ is generated and fed to the differential switch. The standard deviation $\sigma_{hm}$ of the highly-matched operating currents I for different segments is, for example, 10 times better then the standard deviation $\sigma_{pm}$ of the poorly-matched test currents $I_{test}$ for different segments. For example, $\sigma_{hm}$ may be 0.17% or better (e.g. 0.06%), and $\sigma_{pm}$ 1.7% or worse (e.g. 2%). Selection of the main or test current source is controlled by a signal TEST applied to two switches SW3 and SW4, and a signal $\overline{TEST}$ (the inverse of TEST) applied to two switches SW1 and SW2. The TEST signal may be applied externally to the device via an input terminal of the device.

When TEST is low, switch SW1 is ON and switch SW2 is OFF, causing the gate of main cascode transistor 20 to connect to ANALOG VDD, and thus turning that transistor OFF. Switch SW3 is OFF, and switch SW4 is ON, allowing a test cascode bias voltage $V_{pcasctest}$ to pass through to gate of test cascode transistor 25, turning it ON. Thus the poorly-matched test current $I_{test}$ is selected for delivery to the differential DAC switch.

When TEST is high, switch SW1 is OFF and switch SW2 is ON, allowing the main cascode bias voltage $V_{pcasc}$ to pass through to gate of main cascode transistor 20, turning it ON. Switch SW3 is ON, and switch SW4 is OFF, causing the gate of test cascode transistor 25 to connect to ANALOG VDD, and thus turning that transistor OFF. Thus the highly-matched operating current I is selected for delivery to the differential DAC switch.

In one embodiment the width of the main current source transistor 10 is approximately 30 times the width of the test current source transistor 15. The length of the main current source transistor 10 is also approximately 30 times the length of the test current source transistor 15. For example, the relative dimensions of the main current source transistor 10 may be width 240 and length 15, and the relative dimensions of the test current source transistor 15 may be width 8 and length ½. By making the width-to-length ratio of the transistor 15 equal to that of the transistor 10 the bias potentials $V_{pcs}$ and $V_{pcstest}$ may be the same.

In this case, I and $I_{test}$ are both approximately 160 μA. The width-to-length ratios of the transistors 10 and 15 are the same, but the gate area of the transistor 10 is 900 times that of the transistor 15. As the mismatch in current is proportional to $1/\sqrt{(\text{gate area})}$ this makes the mismatch of transistor 10 1/30 that of transistor 15, which is 30 dB lower.

Selection of the test current sources therefore allows significant noise components to be emphasised over background noise and therefore facilitates actual measurement and location of such noise components for use by the manufacturer in testing the device and/or use by an end-user in the setting up of the device for that end-user's particular intended application. Once the noise components have been located in the frequency spectrum using the test current sources, the main current sources can be switched back in to lower the noise components again for normal operation in order to complete the testing or setting-up operation and to confirm that the noise components do not interfere with the normal operation of the device (using the main current sources). Because the frequency positions of the noise components can be determined easily when the test current sources are selected, the same frequency positions can then be examined carefully when the main current sources are switched back in to enable even the much smaller noise components then present to be checked.

Advantageously the physical layout of the main and test current sources is chosen such that the mismatches in the operating currents I correlate to some extent with the mismatches in the test currents $I_{test}$. This may make it possible to reliably optimise the morphing operation, or even select a particular "best" transfer function, based on measurements taken on the test sources which have a sufficiently close correlation with the main sources. Even if there is no or no substantial correlation between the mismatches of the main and test sources, the rotation components will still map to the same frequencies, although their relative magnitudes may differ as between the main sources and the test sources.

The third aspect of the present invention has been described in relation to segmented mixed-signal circuitry which is operable to perform the segment rotation technique but not the segment morphing technique as described above in relation to the first aspect of the present invention. It will readily be appreciated by a person skilled in the art that the technique of the third aspect of the present invention can be applied to segmented mixed-signal circuitry which is operable to perform segment morphing only, or a combination of segment rotation and segment morphing. The ability to select poorly-matched sources can be useful in any segmented mixed-signal circuitry in which it is desired to exaggerate the effects of distortion so as to facilitate the testing or tuning of the device or the selection of appropriate operational parameters.

It will be appreciated that the third aspect of the present invention is also applicable to other types of segmented circuitry such as, for example, segmented circuitry in which each of the segments defines an analog quantity other than a current as described above. The analog quantity could be, for example, a voltage, a capacitance, or a resistance, with each segment having a first portion for defining the analog quantity for that segment in a well-defined manner, and a second portion for defining the analog quantity for that segment in a less well-defined manner, with the actual analog quantity chosen for that segment being selectable between the two. The third aspect of the present invention is also applicable to segmented circuitry other than mixed-signal selected circuitry, for example purely analog circuitry. In this case the segments would be controlled in accordance with an analog rather than digital signal.

It will also be appreciated that all aspects of the present invention are also applicable to mixed-signal circuitry which does not produce a differential output signal. Instead of switching over its current from one line to another, each segment may simply switch its current on or off or change its magnitude in some other way according to the digital input signal.

What is claimed is:

1. Mixed-signal circuitry, operative to perform a series of operation cycles, comprising:
   n circuitry segments which together produce an analog output signal;
   a control signal generating circuit operable in each said cycle to generate, in dependence upon a digital input signal, a set of n segment control signals for application to respective ones of said segments to influence the produced analog output signal; and
   a morphing circuit which causes the n segment control signals to be applied to the n segments in at least two different orders at different respective times, said orders being such that at least one order differs from the next order by more than a starting ordinal position amongst the segments and that the changes in ordinal position of the segments brought about by the changes in order of application of the segment control signals are limited in number and/or magnitude relative to said number n of segments.

2. Circuitry as claimed in claim 1, wherein for each change in order there is at least one segment that is not changed in ordinal position.

3. Circuitry as claimed in claim 1, wherein for each change in order at least n/16 segments are not changed in ordinal position.

4. Circuitry as claimed in claim 1, wherein for each change in order at most n/2 segments have a change in ordinal position.

5. Circuitry as claimed in claim 1, wherein for each change in order at most a pair of segments change ordinal position.

6. Circuitry as claimed in claim 1, wherein each change from one order to the next has an associated segment change parameter, calculated by summing over all n segments the respective ordinal position changes, if any, brought about by the change in order concerned, and the respective segment change parameters associated with the changes in order are each less than is $n^2/4$.

7. Circuitry as claimed in claim 1, wherein each change from one order to the next has an associated segment change parameter, calculated by summing over all n segments the respective ordinal position changes, if any, brought about by the change in order concerned, and the respective segment change parameters associated with the changes in order are each less than or equal to 16 n.

8. Circuitry as claimed in claim 1, wherein each change from one order to the next has an associated segment change parameter, calculated by summing over all n segments the respective ordinal position changes, if any, brought about by the change in order concerned, and the respective segment change parameters associated with the changes in order are each less than 2n.

9. Circuitry as claimed in claim 1, wherein each change from one order to the next has an associated segment change parameter, calculated by summing over all n segments the respective ordinal position changes, if any, brought about by the change in order concerned, and an average value of said segment change parameter per cycle is less than $n^2/64$.

10. Circuitry as claimed in claim 1, wherein each change from one order to the next has an associated segment change parameter, calculated by summing over all n segments the respective ordinal position changes, if any, brought about by the change in order concerned, and an average value of said segment change parameter per cycle is less than 16 n.

11. Circuitry as claimed in claim 1, wherein each change from one order to the next has an associated segment change parameter, calculated by summing over all n segments the respective ordinal position changes, if any, brought about by the change in order concerned, and an average value of said segment change parameter per cycle is less than 2 n.

12. Circuitry as claimed in claim 1, wherein each change from one order to the next has an associated segment change parameter, calculated by summing over all n segments the respective ordinal position changes, if any, brought about by the change in order concerned, and a difference between respective minimum and maximum values of the segment change parameter is limited relative to said number n of segments.

13. Circuitry as claimed in claim 1, wherein said morphing circuit is operable to cause the order of application of said segment control signals to said segments in any one cycle to be selected from among a plurality of predetermined available orders.

14. Circuitry as claimed in claim 13, wherein a total number of said predetermined available orders is greater than 4.

15. Circuitry as claimed in claim 13, wherein a total number of said predetermined available orders is greater than or equal to said number n of segments.

16. Circuitry as claimed in claim 13, wherein each one of said predetermined available orders is selected on a random or pseudo-random basis.

17. Circuitry as claimed in claim 13, wherein changes in order that involve more limited overall changes in ordinal position are caused to occur on average more often than changes in order that involve greater overall changes in ordinal position.

18. Circuitry as claimed in claim 13, wherein said predetermined available orders are such that all changes in order involve approximately the same overall changes in ordinal position, and all changes in order are caused to take place on average with approximately the same frequencies.

19. Circuitry as claimed in claim 1, wherein said changes in order involve swapping the respective ordinal positions of segments belonging to one or more preselected pairs of segments.

20. Circuitry as claimed in claim 1, wherein an average time interval between repetitions of a given change in order is at least 0.1 µs.

21. Circuitry as claimed in claim 1, wherein said morphing circuit is operable to sub-divide the n segments into m groups of segments, where $m \geq 2$, and is operable to change the ordinal positions of segments belonging to the same group.

22. Circuitry as claimed in claim 21, wherein changes in ordinal position are permitted by said morphing circuit in m−1 or fewer of said m groups at any one time.

23. Circuitry as claimed in claim 21, wherein changes in ordinal position are permitted by said morphing circuit in only one group at any one time.

24. Circuitry as claimed in claim 21, wherein n=128 and m=8 or 16.

25. Circuitry as claimed in claim 21, wherein the ordinal positions of segments belonging to the same group are spread out over the range of n possible ordinal positions.

26. Circuitry as claimed in claim 1, having a decoder circuit corresponding to each segment and connected for receiving said digital input signal and an ID signal, and operable to set a logic state of the segment control signal applied to its corresponding segment in dependence upon the result of a comparison between said digital input signal and said ID signal;
said morphing circuit being operable to cause the respective ID signals received by the decoder circuits of different segments to change to bring about said changes in order.

27. Circuitry as claimed in claim 26, wherein said morphing circuit is operable to sub-divide the n segments into m groups of segments, where $m \geq 2$, and is operable to change the ordinal positions of segments belonging to the same group, and wherein parts of the decoder circuits corresponding to segments belonging to the same group of segments are shared.

28. Circuitry as claimed in claim 1, further comprising a segment rotating circuit operable in each said cycle to rotate said ordinal positions by r segments as compared to the preceding cycle, where r is a rotation amount set for the cycle concerned.

29. A noise shaping method, for use in mixed-signal circuitry that is operative to perform a series of operation cycles and comprises n circuitry segments which together produce an analog output signal, said method comprising:
in each said cycle generating, in dependence upon a digital input signal, a set of n segment control signals for application to respective ones of said segments to influence the produced analog output signal; and
causing the n segment control signals to be applied to the n segments in at least two different orders at different respective times, said orders being such that at least one order differs from the next order by more than a starting ordinal position among the segments and that the changes in ordinal position of the segments brought about by the changes in order are limited in number and/or magnitude relative to said number n of the segments.

30. Segmented circuitry comprising:
a plurality of circuitry segments, each having a first analog quantity defining circuit operable to define a first analog quantity for its segment, and also having a second analog quantity defining circuit operable to define a second analog quantity for its segment, said second analog quantity being less well-defined than said first analog quantity for the segment concerned;
an analog quantity selecting circuit which selects said first analog quantities or said second analog quantities; and
a combining circuit operable to produce a combined analog quantity based on the respective selected analog quantities of a combination of the circuitry segments.

31. Circuitry as claimed in claim 30, wherein said first analog quantity is approximately the same as said second analog quantity for each individual circuitry segment.

32. Circuitry as claimed in claim 30, wherein said first analog quantities are approximately the same for all circuitry segments and said second analog quantities are approximately the same for all circuitry segments.

33. Circuitry as claimed in claim 32, wherein a standard deviation of said first analog quantities is smaller than a standard deviation of said second analog quantities.

34. Circuitry as claimed in claim 30, wherein each said first and second analog quantity is a current.

35. Circuitry as claimed in claim 34, wherein each said first and second analog quantity defining circuits comprise a constant-current field-effect transistor for sourcing or sinking said current, and said constant current transistor in said first analog quantity defining circuit is greater in gate area than said constant current transistor in said second analog quantity defining circuit.

36. Circuitry as claimed in claim 35, wherein said constant current transistor in said first analog quantity defining circuit is approximately equal in width-to-length ratio to said constant current transistor in said second analog quantity defining circuit.

37. Circuitry as claimed in claim 30, wherein said analog quantity selecting circuit selects said first analog quantities or said second analog quantities in accordance with a control signal applied externally to the circuitry.

38. Circuitry as claimed in claim 30, operative to perform a series of operation cycles, and further comprising:
   a control signal generating circuit operable in each said cycle to generate, in dependence upon a digital input signal, a set of segment control signals for application to respective ones of said segments to influence said combined analog quantity; and
   a noise shaping circuit which causes the segment control signals to be applied to said segments in at least two different orders at different respective times, thereby to convert distortion, caused by mismatches between said first analog quantities of different segments, into noise components at preselected desired frequencies.

39. Circuitry as claimed in claim 38, wherein said noise shaping circuit comprises a segment rotating circuit operable in each said cycle to rotate respective ordinal positions of the segments by r segments as compared to the preceding cycle, where r is a rotation amount set for the cycle concerned.

40. Circuitry as claimed in claim 38, wherein said noise shaping circuit comprises a morphing circuit which sets said different orders such that at least one order differs from the next order by more than a starting ordinal position amongst the segments and that on average per cycle the changes in ordinal position of the segments brought about by the changes in order of application of the segment control signals are limited in number and/or magnitude relative to a total number of the segments.

41. A method of testing segmented circuitry operative to perform a series of operation cycles and which comprises:
   a plurality of circuitry segments, each having a first analog quantity defining circuit operable to define a first analog quantity for its segment, and also having a second analog quantity defining circuit operable to define a second analog quantity for its segment, said second analog quantity being less well-defined than said first analog quantity for the segment concerned;
   an analog quantity selecting circuit which selects said first analog quantities or said second analog quantities;
   a combining circuit operable to produce a combined analog quantity based on the respective selected analog quantities of a combination of the circuitry segments;
   a control signal generating circuit operable in each said cycle to generate, in dependence upon a digital input signal, a set of segment control signals for application to respective ones of said segments to influence said combined analog quantity; and
   a noise shaping circuit which causes the segment control signals to be applied to said segments in at least two different orders at different respective times, thereby to convert distortion, caused by mismatches between said first analog quantities of different segments, into noise components at preselected desired frequencies;
   the method of testing comprising:
   causing said analog quantity selecting circuit to select said second analog quantities;
   setting operating parameters of said noise shaping circuit, used by said noise shaping circuit to influence said different orders; and
   carrying out measurements on a signal derived from said combined analog quantity so as to identify the positions in a frequency spectrum of that signal of said noise components.

42. Mixed-signal circuitry, operative to perform a series of operation cycles, comprising:
   n circuitry segments which together produce an analog output signal;
   control signal generating means operable in each said cycle to generate, in dependence upon a digital input signal, a set of n segment control signals for application to respective ones of said segments to influence the produced analog output signal; and
   morphing means for causing the n segment control signals to be applied to the n segments in at least two different orders at different respective times, said orders being such that at least one order differs from the next order by more than a starting ordinal position amongst the segments and that the changes in ordinal position of the segments brought about by the changes in order of application of the segment control signals are limited in number and/or magnitude relative to said number n of segments.

43. Segmented circuitry comprising:
   a plurality of circuitry segments, each having first analog quantity defining means operable to define a first analog quantity for its segment, and also having second analog quantity defining means operable to define a second analog quantity for its segment, said second analog quantity being less well-defined than said first analog quantity for the segment concerned;
   analog quantity selecting means for selecting said first analog quantities or said second analog quantities; and
   combining means operable to produce a combined analog quantity based on the respective selected analog quantities of a combination of the circuitry segments.

44. Circuitry as claimed in claim 43, operative to perform a series of operation cycles, and further comprising:
   control signal generating means operable in each said cycle to generate, in dependence upon a digital input signal, a set of segment control signals for application to respective ones of said segments to influence said combined analog quantity; and
   noise shaping means for causing the segment control signals to be applied to said segments in at least two different orders at different respective times, thereby to convert distortion, caused by mismatches between said first analog quantities of different segments, into noise components at preselected desired frequencies.

* * * * *